United States Patent
Nomura et al.

(10) Patent No.: US 7,618,526 B2
(45) Date of Patent: Nov. 17, 2009

(54) METHOD FOR MANUFACTURING PLATED FILM, CATHODE ROLL FOR PLATING, AND METHOD FOR MANUFACTURING CIRCUIT BOARD

(75) Inventors: Fumiyasu Nomura, Otsu (JP); Hiroshi Harada, Shimonoseki (JP)

(73) Assignees: Toray Industries, Inc., Tokyo (JP); Toray Advanced Film Co., Ltd., Tokyo (JP)

( * ) Notice: Subject to any disclaimer, the term of this patent is extended or adjusted under 35 U.S.C. 154(b) by 714 days.

(21) Appl. No.: 10/518,194

(22) PCT Filed: Jun. 13, 2003

(86) PCT No.: PCT/JP03/07537

§ 371 (c)(1),
(2), (4) Date: Sep. 20, 2005

(87) PCT Pub. No.: WO03/106740

PCT Pub. Date: Dec. 24, 2003

(65) Prior Publication Data

US 2006/0118424 A1     Jun. 8, 2006

(30) Foreign Application Priority Data

Jun. 17, 2002  (JP)  ............... 2002-175948
Jun. 17, 2002  (JP)  ............... 2002-175949

(51) Int. Cl.
*C25D 5/00*   (2006.01)
*C25D 5/56*   (2006.01)
*C25D 7/06*   (2006.01)

(52) U.S. Cl. .................. 205/147; 205/138; 205/164

(58) Field of Classification Search ............... 205/147, 205/138, 164
See application file for complete search history.

(56) References Cited

U.S. PATENT DOCUMENTS 3,794,571 A * 2/1974 Beyer et al. .............. 205/498

FOREIGN PATENT DOCUMENTS

GB          551103        2/1942

(Continued)

OTHER PUBLICATIONS

Masui et al., "Warp Control in Strip Processing Plant", ISIJ International, vol. 31 (no month, 1991), No. 3, pp. 262-267.*

*Primary Examiner*—Edna Wong
(74) *Attorney, Agent, or Firm*—RatnerPrestia

(57) ABSTRACT

A method for manufacturing a plated film by bringing a film having a conductive surface into electrical contact with a cathode roll with a liquid film interposed between the film and the cathode and forming a metal plating on the conductive surface of the film, characterized in that the relation $E_0 > [(I/Cs) \times d]/\sigma$ where $E_0$ is the reduction potential of the metal forming the plating, I is the value of the current flowing through the cathode roll for plating, Cs is the area of the conductive surface of the film in electrical contact with the cathode roll with a liquid film interposed therebetween, d is the thickness of the gap between the cathode roll and the conductive film, and $\sigma$ is the conductivity of the liquid forming the liquid film present in the gap. A cathode roll having a surface roughness Rmax of 1 μm or less is also disclosed. Further a cathode roll having a Vickers hardness of the surface of 200 or more is disclosed.

8 Claims, 11 Drawing Sheets

FOREIGN PATENT DOCUMENTS

| | | | |
|---|---|---|---|
| GB | 551103 A | * | 2/1942 |
| JP | 63250492 A | * | 10/1988 |
| JP | 07 022473 | | 1/1995 |
| JP | 07022473 A | * | 1/1995 |
| JP | 07 062599 A | | 3/1995 |
| JP | 2001 192793 | | 7/2001 |

* cited by examiner

The results of measuring the carrying tensions (Comparative Example 4)

METHOD FOR MANUFACTURING PLATED FILM, CATHODE ROLL FOR PLATING, AND METHOD FOR MANUFACTURING CIRCUIT BOARD

This application is a U.S. National Phase Application of PCT International Application PCT/JP03/07537 filed Jun. 13, 2003.

TECHNICAL FIELD

The present invention relates to a method for manufacturing a plated film, a cathode roll for plating, and a method for producing a circuit board.

The invention relates to an improvement in a method for manufacturing a plated film, in which a film carrying means for carrying a film having a conductive surface, a cathode roll, and a plating bath arranged in the upstream and/or downstream side of the cathode roll and accommodated with a plating solution and an anode are used in such a manner that while the film is carried by the film carrying means, the conductive surface of the film is brought into electrical contact with the cathode roll through a liquid layer, and passed through the plating bath for forming a plating layer on the conductive surface of the film. Furthermore, the invention relates to an improvement of the cathode roll. Still further, the invention relates to a method for manufacturing a circuit board, comprising the step of forming a circuit pattern on the plated film manufactured by the method for manufacturing a plated film.

The invention can be preferably used for producing a plated resin film.

The invention allows the production of a plated film having good surface properties. Since the plated film produced by the invention is substantially free from projected or depressed flaws on the plating layer formed, it can be preferably used for producing a circuit board by forming a superfine circuit pattern at a wire pitch of 80 μm or less.

The invention can be preferably used for producing a plated film in which an electroplating layer is formed on a vapor-deposited metal layer of a film having the vapor-deposited metal layer formed by metal evaporation, that is, which has a layered-laminate comprising a vapor-deposited metal layer and an electroplating layer formed on it.

The invention can be preferably used for producing a plated film comprising a film, an electroless plating layer formed on the film by an electroless plating and an electroplating layer formed on the electroless plating layer, that is, which has a layered-laminate consisting of an electroless plating layer and an electroplating layer formed thereon. These plated films can be used as parts of electronic apparatuses and contribute to the size reduction and weight reduction of the parts. Furthermore, they can be respectively preferably used as a two-layer flexible printed wiring board free from an adhesive favorable in view of cost reduction. The two-layer flexible printed wiring board can be used, for example, for TAB, COF and PGA in semiconductor packaging.

BACKGROUND ART

Methods for continuously forming a plating layer on a surface of a film while carrying the film are described in JP-A-07-22473 and JP-A-2001-192793. In these methods, a conductive surface of a non-metallic film or a metallic film is brought into contact with a cathode roll, and the film is carried and passed through a plating bath arranged in the upstream and/or downstream side of the cathode roll and accommodated with a plating solution and an anode, for forming a plating layer on the conductive surface in the plating bath. In these methods, plural units, each consisting of a cathode roll and a plating bath, are installed, and the film is carried and passed through the plural plating units one after another, to form a plating layer having a desired thickness on the conductive surface of the film.

Substrates for flexible circuits are used in electronic apparatuses, electronic parts, semiconductor packages, etc. As one of the substrates, a wiring board consisting of a polyimide film or polyester film and a copper foil is used. As the wiring boards, there are a board usually called "a three-layer type" in which a copper foil is stuck to a film through an adhesive and a board usually called "a two-layer type" in which a metallic layer is formed on a film by means of plating or the like without using an adhesive. Recently the wiring of circuits is formed at a finer pitch, and among these board types, the latter two-layer type attracts more attention.

In a three-layer board for printed circuit, an epoxy-based resin or acrylic resin is used as the adhesive. This board has a disadvantage that the electric properties are deteriorated due to impurity ions contained in the adhesive. The heat resistance temperature of the adhesive of the board is from 100° C. to 150° C. and therefore, in the case where a polyimide film is used as the base film, the board has a disadvantage that the high heat resistance of the film of 300° C. or higher cannot be sufficiently utilized. As a result, in the wire bonding to an IC chip in need of high temperature, the heating temperature used must be lowered.

In a three-layer board for printed circuit, the general thickness of the copper foil is 18 μm or 35 μm. Therefore, in the case where patterning is performed at a wire pitch of 80 μm (the copper wire width: 40 μm and the inter-wire gap: 40 μm) or less, copper is so thick as to remarkably lower the etching rate, and in addition, the circuit width on the surface side of the copper foil becomes very different from the circuit width of the adhesive side. Otherwise, there occurs a phenomenon that etching makes the entire circuit width very thin, not allowing a desired circuit pattern to be obtained.

To solve the above-mentioned problems in the three-layer type, a two-layer board for printed circuit free from the use of an adhesive is proposed. A two-layer board can be produced by vapor-depositing any of various metals on a film by any of various vapor deposition methods such as vacuum evaporation, sputtering or any of various ion plating methods (including PVD method, CVD method of vaporizing chemicals including a metal for deposition), to form a conductive surface, or plating a film with any of various metals by an electroless plating method to form a conductive surface, and subsequently electrolytically plating the conductive surface with copper.

In a two-layer board, the thickness of the copper layer can be changed freely by means of electrolytic copper plating. For example, if a copper layer having a thickness of 8 μm is obtained, a circuit pattern at a wire pitch of 60 μm can be simply produced, and the heat resistance of any of various base films can be sufficiently utilized. Based on such situation, the demand for plated films is growing.

However, when a continuously carried film is plated, the magnitude of the tension acting on the film in the carrying process cannot be so large in view of the stiffness of the film.

Furthermore, unless there is certain slipperiness between the carried film and the cathode roll, the carried state of the film is disturbed by the cathode roll, and the carrying tension is unbalanced at plural portions in the width direction of the film. The unbalance causes the carried film to be wrinkled and creased, making the carried state unstable.

With regard to this problem, in the conventional apparatus, the running film that accompanies the plating solution taken from the plating bath reaches the cathode roll, to form a liquid layer on the cathode roll, and this liquid layer solves the problem. The liquid layer gives some slipperiness between the film and the cathode roll. The slipperiness prevents that the carried state of the film becomes unstable at plural portions in the width direction of the film.

Furthermore, as described in JP-A-2001-192793, if the carried film is a metallic foil such as a copper foil, the carrying tension of the film can be made large, and the surface resistance value can also be kept small, allowing perfect conduction with the cathode roll to be achieved, without causing any problem.

However, as described in JP-A-07-22473, if it is attempted to carry a polyimide film having a thickness of 50 μm, the film may be fractured in view of the Young's modulus and strength of the film, etc. Furthermore, an internal stress may work in the formed plating layer. Therefore, a large tension cannot be applied to the film, and employed is a method of forming a plating layer while the carried state of the film is balanced under a relatively low film tension. That is, a liquid layer containing a plating solution is interposed between the cathode roll and the film, for causing adequate slipperiness between the cathode roll and the film, to stabilize the carrying of the film.

However, even in this method, if an electric current is fed from the cathode roll for forming a plating layer, it often occurs that the metal intended to constitute the plating layer is precipitated and deposited on the cathode roll.

There occurs a phenomenon in which the metal deposited on the cathode roll is brought into the plating bath by the film and acts as nuclei in the plating bath, to form abnormal projections (projection defects) on the conductive surface or the plating layer surface due to electric field concentration. There also occurs a phenomenon in which the metal deposited on the cathode roll forms depressions in the film or flaws the conductive surface or plating layer surface. The thickness of the plating layer formed further subsequently is not enough to flatten the depressions or the flawed portions. As a result, the surface of the plated film produced has depression defects. Moreover, the patterns of the metal deposited on the cathode roll are transferred to the conductive surface of the film, to cause a problem of degrading the surface appearance quality.

The depression and projection defects formed on the surface of the plated film may cause such non-conformances as wire breaking in the etching step for forming circuit wiring or in the step of bonding IC chips and the like in the circuit mounting process, to cause a problem that the quality of the circuit cannot be guaranteed.

The method for inhibiting the precipitation of the metal intended to constitute the plating layer on the cathode rolls causing such problems is not yet found. At present, after the apparatus has been operated for a certain time, the production is stopped, and the metal precipitated and deposited on the cathode rolls is scraped off. Then, the operation of the apparatus is resumed. The metal removal from the cathode rolls remarkably lowers the productivity of the plated film.

On the other hand, the conventional cathode rolls are formed of an iron-based material. Furthermore, the plating solution is based on sulfuric acid, and it often contains hydrochloric acid. Therefore, the cathode rolls have a problem that the selection of the material for corrosion prevention is difficult. In this situation, SUS316 has been suitably used as a material resistant against the plating solution. However, even the SUS316 has a problem that intergranular corrosion is caused after it has been used for a certain time.

The cathode rolls function also as rolls for carrying the film. The cathode rolls have a problem that they are rubbed by the running film and are gradually flawed. Therefore, if the cathode rolls are used for production for a certain time, they are flawed to increase the frictional force with the film, causing such a state that the film is gripped. This state causes the film to be tensioned and deflected and further causes it to sway irregularly in the horizontal direction, thereby wrinkling it during the carrying process. In the worst case, the running film is creased.

Furthermore, as the case may be, it can happen that the metal intended to constitute the plating layer, for example, copper is precipitated and deposited on the cathode rolls. If the deposit, for example, copper is scraped off for being removed, using a sponge containing an abrasive, the SUS316 used as the material constituting the cathode rolls is often flawed.

The flaw patterns are transferred to the plating layer, for example, copper layer of the plated film produced. The plated film having the transferred flaws has surface appearance quality defects called hair lines. The hair lines are depression flaws, and cause wire breaking in the etching step for forming circuit wiring and in the step of bonding IC chips in the circuit mounting process. As a result, the quality of the produced circuit may not be able to be guaranteed.

Moreover, the cathode rolls used for plating are heavily consumed due to flawing. In the case where the cathode rolls are used for continuous production, they must be exchanged for being reground after use for two weeks or about one month. This greatly increases the maintenance work and cost of the apparatus, to lower productivity, hence to raise the production cost.

To solve this problem, JP-3135176 proposes a method in which a plating surface, for example, copper surface in a product of a flexible circuit board is not brought into contact with a cathode roll. This is a so-called contact-less carrying method and at now it is used for manufacturing a plated film. An outline of this method is shown with FIG. 17. In FIG. 17, carrier rolls 52 and 53 have large-diameter discs 52a, 52b, and 53a, 53b at their both ends respectively. A film 50 is carried by being guided both edge portions 51a, 51b of the film 50 with these discs. In FIG. 17, symbol W denotes the overall width of the film 50, and symbol Wa denotes the width of the non-contact portion. When the film 50 is carried, a liquid is made to flow from the inside of the carrier roll 53 toward the outside, for letting a force for biasing the film 50 toward outside acts on the film 50. The liquid is fed from a liquid source 55 through a flow rate control unit 56, being injected from the respective nozzle holes 58 of a nozzle pipe 57.

However, if the film 50 is carried by this method, the liquid giving a biasing force from the inside of the roll becomes unstable, and the film 50 deviates from the large-diameter portions (disc portions) of the carrier roll, not allowing continuous production. Furthermore, in the case where the carrier roll 53 is a cathode roll, when the power is supplied from both the ends, the power supply area is small, and the power supply is likely to be unstable. As a result, the thickness of the formed plating layer becomes irregular. The cathode roll for plating is heavily consumed, and in the case of continuous production, the cathode roll for plating must be exchanged for being reground after use of two weeks to about one month. This greatly increases the maintenance work and cost of the apparatus, to lower the productivity and to raise the production cost.

Electric and electronic apparatuses are being substituted by IC version, and become more highly dense and more highly integrated at a rapid pace. In this connection, the wire pitch of patterns of flexible printed circuit boards become finer from a pitch ranging from 150 to 200 μm to a pitch ranging from 80 to 150 μm, and presently there is a demand for producing patterns at a wire pitch ranging from 30 to 80 μm. In future, a demand for producing patterns at a wire pitch of less than 80 μm is expected to arise.

An object of the invention is to provide a method for producing a plated film that solves the above-mentioned problems of the prior art and can meet the above-mentioned demand.

Another object of the invention is to provide a cathode roll usable in the method for producing a plated film that can solve the above-mentioned problems of the prior art and can meet the above-mentioned demand.

DISCLOSURE OF THE INVENTION

A method for producing a plated film of the invention is that a film carrying means for carrying a film having a conductive surface, a cathode roll, and a plating bath arranged in the upstream and/or downstream side of the cathode roll and accommodated with a plating solution and an anode are used in such a manner that while the film is carried by the film carrying means, the conductive surface of the film is brought into electrical contact with the cathode roll through a liquid layer, and passed through the plating bath for forming a plating layer on the conductive surface of the film, characterized in that the following relation is satisfied:

$$E_0 > [(I/Cs) \times d]/\sigma$$

where $E_0$ is the reduction potential of a metal constituting the plating layer; I is the value of a current flowing through the cathode roll for plating; Cs is the area of the conductive surface of the film in electrical contact with the cathode roll through the liquid layer; d is the thickness of a gap between the cathode roll and the conductive surface of the film; and σ is the conductivity of a liquid constituting the liquid layer.

It is preferred that the conductivity of the liquid constituting the liquid layer existing in the gap is controlled by means of the concentration of an electrolyte mainly composed of sulfuric acid.

It is preferred that the conductivity of the liquid constituting the liquid layer existing in the gap is from 1 mS/cm to 100 mS/cm.

It is preferred that the thickness d of the gap is from 20 μm to 500 μm.

It is preferred that the thickness d of the gap is controlled by means of a carrying tension of the film.

It is preferred that the carrying tension of the film is from 10 N/m to 320 N/m.

It is preferred that the plating layer is composed of copper.

It is preferred that the film is made of a polyimide resin or polyester resin.

It is preferred that a material for constituting the plating layer and precipitated on a surface of the cathode roll is removed by means of a blade and/or an elastic body provided in contact with the surface of the cathode roll.

It is preferred that a liquid is supplied continuously or intermittently to at least one of the cathode roll, the blade and the elastic body.

A cathode roll for plating of the invention, used for producing a plated film by a method, in which a film carrying means for carrying a film having a conductive surface, a cathode roll, and a plating bath arranged in the upstream and/or downstream side of the cathode roll and accommodated with a plating solution and an anode are used in such a manner that while the film is carried by the film carrying means, the conductive surface of the film is brought into electrical contact with the cathode roll through a liquid layer, and passed through the plating bath for forming a plating layer on the conductive surface of the film, is characterized in that the surface roughness Rmax of the cathode roll is 1 μm or less.

A cathode roll for plating of the invention, used for producing a plated film by a method, in which a film carrying means for carrying a film having a conductive surface, a cathode roll, and a plating bath arranged in the upstream and/or downstream side of the cathode roll and accommodated with a plating solution and an anode are used in such a manner that while the film is carried by the film carrying means, the conductive surface of the film is brought into electrical contact with the cathode roll through a liquid layer, and passed through the plating bath for forming a plating layer on the conductive surface of the film, is characterized in that the Vickers hardness of the cathode roll is 200 or more.

In the cathode roll for plating of the invention, it is preferred that a surface layer mainly composed of tungsten is formed thereon.

In the cathode roll for plating of the invention, it is preferred that a surface layer containing 50% or more of tungsten and further containing at least one element selected from the group consisting of chromium, nickel and carbon is formed thereon.

In the cathode roll for plating of the invention, it is preferred that a surface layer containing 60 to 80 wt % of tungsten, 15 to 25 wt % of chromium, 1 to 10 wt % of nickel, and 1 to 10 wt % of carbon is formed thereon.

In the cathode roll for plating of the invention, it is preferred that the surface thereof is treated by a thermal spraying method.

It is preferred that the thermal spraying method is a denotation flame spraying method.

It is preferred that the porosity of a thermally sprayed layer formed by surface treatment based on the thermal spraying method is 2% or less.

If the cathode roll for plating of the invention is used as the cathode rolls for carrying out the method for producing a plated film of the invention, plural films are allowed to run in parallel to each other along the cathode rolls.

The method for producing a circuit board of the invention is characterized in that a circuit pattern is formed on a plated film produced by the method for producing a plated film of the invention.

THE BEST MODES FOR CARRYING OUT THE INVENTION

A mode of the method for producing a plated film of the invention is explained below in reference to drawings.

Figure 1:
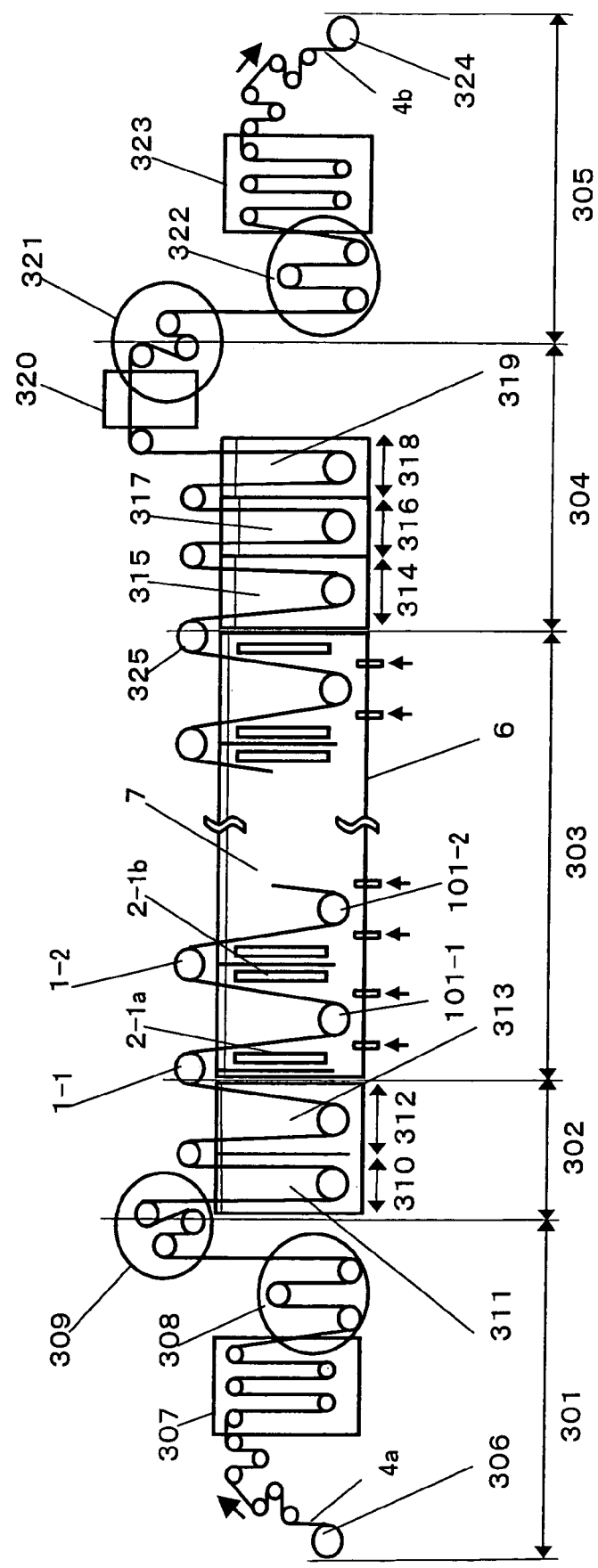
FIG. 1 is a schematic vertical sectional view showing a mode of the apparatus for producing a plated film, used for carrying out the invention.

FIG. 1 schematically shows a continuous electroplating apparatus as a whole in which a film 4a having a conductive surface is continuously unwound and carried from a film unwinding means 306 by a film carrying means, and plated in a plating bath 6, being wound as a plated film 4b by a film winding means 324.

The process for producing the plated film 4b in the apparatus comprises a film supplying step 301 for unwinding the film 4a having a conductive surface from a roll film, a pre-treatment step for, for example, treating the conductive surface of the film 4a with acid treatment, degreasing treatment, water washing, etc., an electroplating step 303 for forming a plating layer on the conductive surface, a post-treatment step 304 for removing or washing away the plating solution, treating for rust prevention, washing away the treatment residue, and further drying, and a winding step 305 for winding the produced plated film 4b into a film roll. In the case where the conductive surface of the film 4a is clean, the pre-treatment step 302 can be omitted. In the case where it is not necessary to post-treat the produced plated film 4b, the post-treatment step 304 can be omitted.

In FIG. 1, the film 4a having a conductive surface unwound from the film unwinding means 306 is adjusted in its carrying tension while it passes through an accumulator 307 and further through a balance roll section 308. Subsequently, the running film 4a is controlled to be substantially constant in the running speed, while it passes through a speed control roll section 309. Then, the running film 4a passes through an acid treatment and degreasing treatment section 310 and a water washing section 312 and is introduced into the plating bath 6 containing a plating solution 7. Part of the plating bath 6 is shown in FIG. 2 as an enlarged view.

Figure 2:
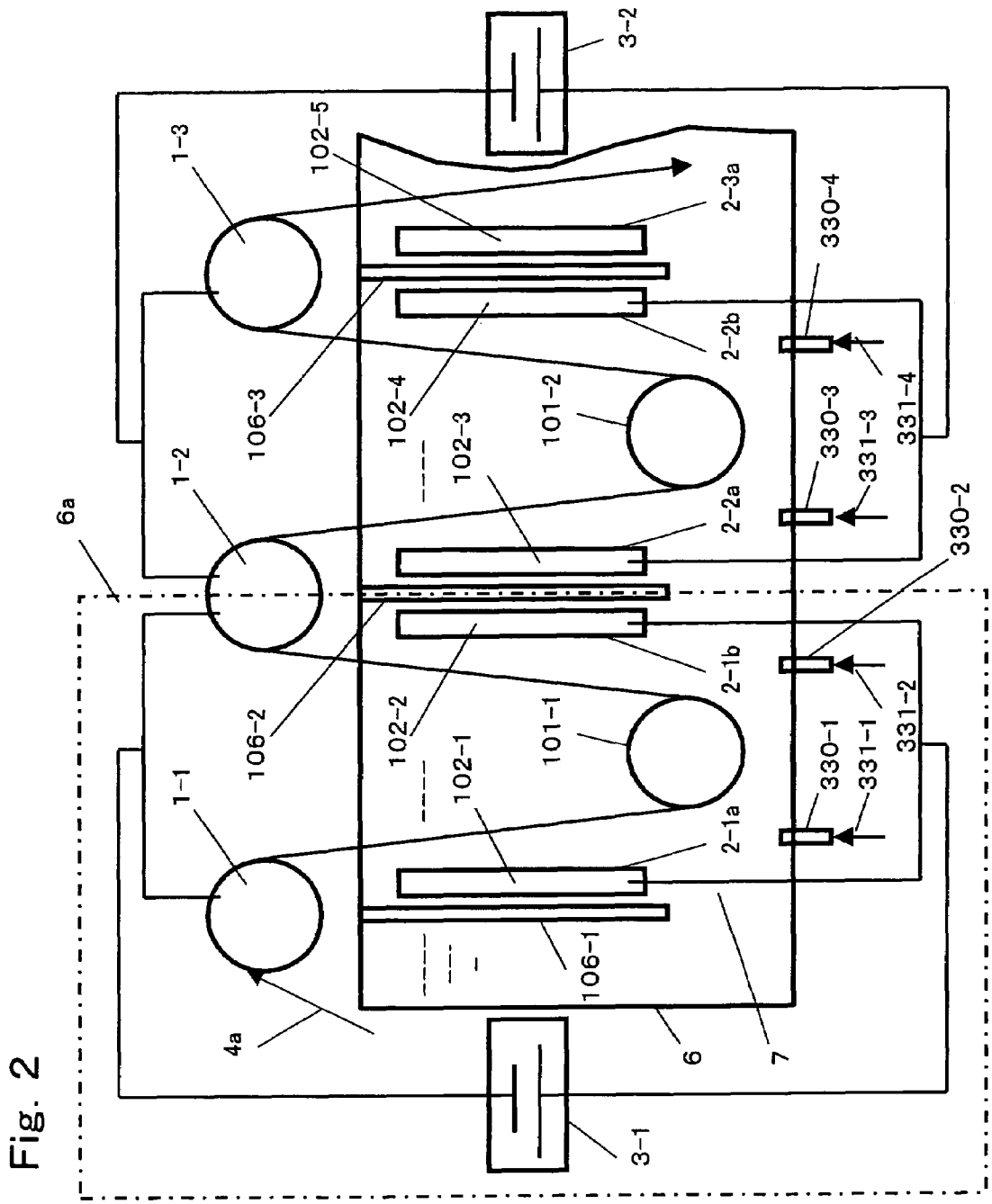
FIG. 2 is a schematic vertical sectional view partially showing the cathode rolls and the plating bath in the apparatus of FIG. 1.

In FIG. 2, the film 4a runs along a cathode roll 1-1 while its conductive surface is kept in electrical contact with the cathode roll 1-1, and is then introduced into the plating bath 6. In the plating bath 6, the film 4a passes along a submerged roll 101-1 and is raised out of the plating bath 6, reaching the next cathode roll 1-2.

The plating bath 6 accommodates cases 102-1 and 102-2 respectively packed with accumulated copper balls. The cases 102-1 and 102-2 act as anodes 2. The cathode rolls 1-1 and 1-2 act as cathodes. The electric current from a rectifier (DC power source) 3-1 flows between the anodes and the cathodes. In the plating bath 6, shielding plates 106-1 and 106-2 are provided for the respective anodes 2. This constitution forms one plating unit 6a surrounded by a one-dot-dash-line in FIG. 2.

Similarly the subsequent unit consists of cathode rolls 1-2 and 1-3 acting as cathodes, an submerged roll 101-2, cases 102-3 and 102-4 respectively packed with accumulated copper balls and acting as anodes 2, shielding plates 106-2 and 106-3, and a rectifier (DC power source) 3-2. In the electroplating apparatus shown in FIG. 1, many such plating units 6a are disposed continuously from the upstream side to the downstream side in the film 4a carrying direction. The film 4a passes the respective units 6a one after another, to be increased in the thickness of the plating layer formed on its conductive layer.

It is preferred that the electric current condition in the respective units 6a is selected to ensure that the current density for the film 4a can be kept in a range from 0.2 to 10 A/dm$^2$. The definition of the current density is described later. On the conductive layer of the film 4a coming out of the last unit 6a after passing the respective units 6a one after another, a plating layer having a thickness of 1 to 30 μm is formed.

In the bottom of the plating bath 6, air inlets (nozzles for air stirring) 330-1, 330-2, 330-3 and 330-4 are provided. It is preferred that fresh air 331-1, 331-2, 331-3 and 331-4 is introduced from these air inlets and released into the plating solution 7, for stirring the plating solution 7 in the plating bath 6. This improves the uniformity of the formed plating layer. In this case, supplying fresh air to the region where the plating layer is formed is effective for improving the uniformity of the plating layer. The reason is that the concentration of the metal ions destined to form the plating layer near the surface of the formed plating layer is enhanced.

Though not shown in the drawing, it is preferred that the plating solution 7 in the plating bath 6 is let out of the plating bath, filtered to get rid of contaminants, and introduced into the plating bath 6 in constant circulation.

The plated film 4b coming out of the plating bath 6 after completion of plating layer formation passes along a roll 325 used for detecting the tension of the film. Subsequently, the plated film 4b passes through a water washing step 314 for treating the film using washing water 315 for removing the adhering plating solution, a rust prevention treatment step 316 for protecting the formed plating layer using a rust prevention treatment liquid 317, a water washing step 318 for removing the excessive rust prevention treatment liquid, and a drying step 320 having a drying furnace used for removing water, one after another.

The plated film 4b coming out of the drying step 320 passes through a speed adjusting section 321 and a balance roll section 322, to be adjusted in its tension. The plated film 4b adjusted in its tension passes through an accumulator 323 and wound as a film roll by a film winding means 324.

Figure 3:
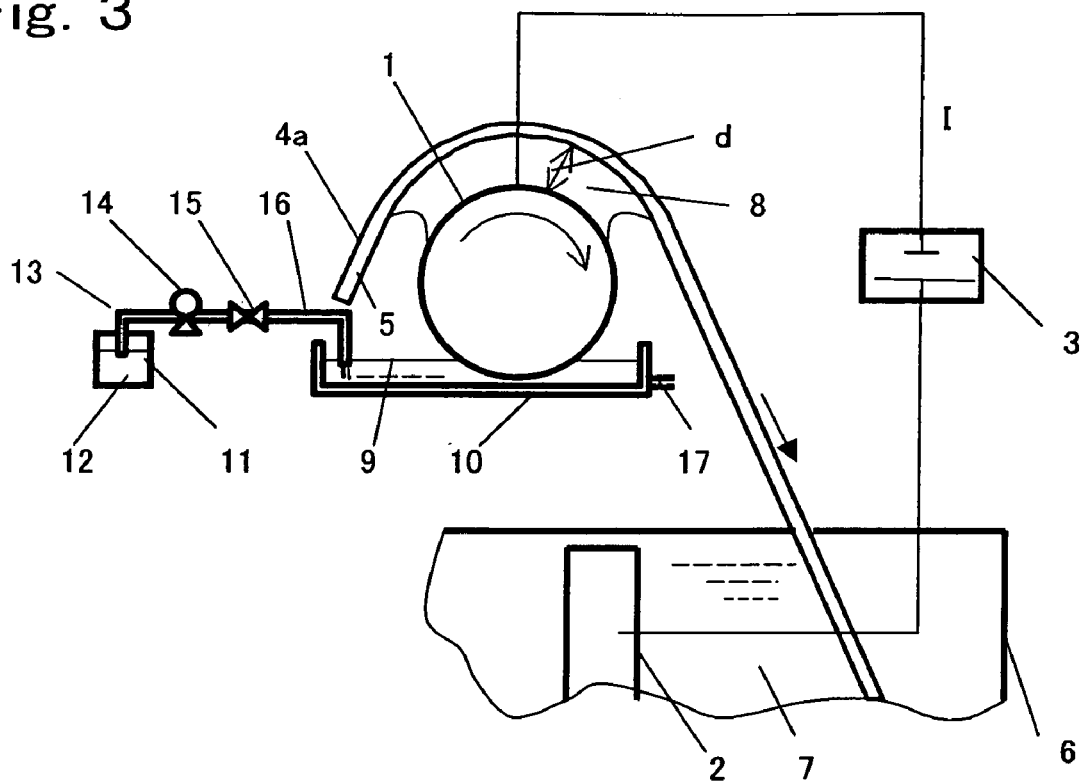
FIG. 3 is a schematic vertical sectional view showing a mode of a cathode roll unit used for carrying out the invention.

FIG. 3 is an enlarged vertical sectional view showing an example of the cathode roll unit used in the plated film production process for carrying out the plated film production method of the invention. The cathode roll unit comprises a cathode roll 1, an electrolyte accommodating pan 10, an adjusting tank 11 for adjusting the electrolyte, and an electrolyte supply device consisting of pipes 13 and 16 for supplying the electrolyte to the electrolyte accommodating pan 10.

In FIG. 3, the film 4a having the conductive surface 5 is kept in electrical contact with the cathode roll 1, with the conductive surface 5 turned on the side of the cathode roll 1, while it runs in the clockwise direction in FIG. 3, being carried into the plating bath 6. The cathode roll 1 is connected with a motor (not shown in the drawing), and rotated in the clockwise direction in FIG. 3.

A liquid layer 8 is interposed between the conductive surface 5 of the film 4a and part of the circumferential surface of the cathode roll 1. Symbol d denotes the thickness of the liquid layer 8.

Below the cathode roll 1, the electrolyte accommodating pan 10 is installed. The electrolyte accommodating pan 10 is supplied with a concentration-controlled electrolyte 9. In the electrolyte 9, part of the cathode roll 1 is immersed. The cathode roll 1 is rotated while it is incessantly bathed in the electrolyte 9. With the rotation, the electrolyte 9 is supplied to the region where the liquid layer 8 is formed. As a result, the liquid layer 8 is formed between the conductive surface 5 of the film 4a and the surface of the cathode roll 1.

The electrolyte 9 is supplied from the adjusting tank 11 accommodating a concentration-controlled electrolyte 12 through the pipes 13 and 16 to the electrolyte accommodating pan 10. The pipes 13 and 16 are provided with a liquid feed pump 14 and a valve section (electromagnetic valve) 15. The amount of the electrolyte 12 supplied to the electrolyte accommodating pan 10 is strictly controlled by the action of the valve 15 or by the action of the pump 14. The electrolyte 9 in the electrolyte accommodating pan 10 changes in concentration, since the plating solution of the plating unit 6a (FIG. 2) positioned on the upstream side in the running direction of the film 4a is brought into the electrolyte accommodating pan 10. To prevent the concentration change, the electrolyte is discharged from a discharge port 17, and the concentration-adjusted electrolyte 12 is supplied from the pipe 16.

The rectifier 3 supplies current IA from the cathode roll 1 to the anode 2 formed as a case packed with accumulated copper balls. It is preferred that the current density in this case is selected in a range from 0.2 to 10 A/dm$^2$. The current density refers to a value obtained by dividing the current applied from the rectifier 3, by the area of the film 4a in the portion immersed in the plating solution 7 of the plating bath 6.

Figure 4:
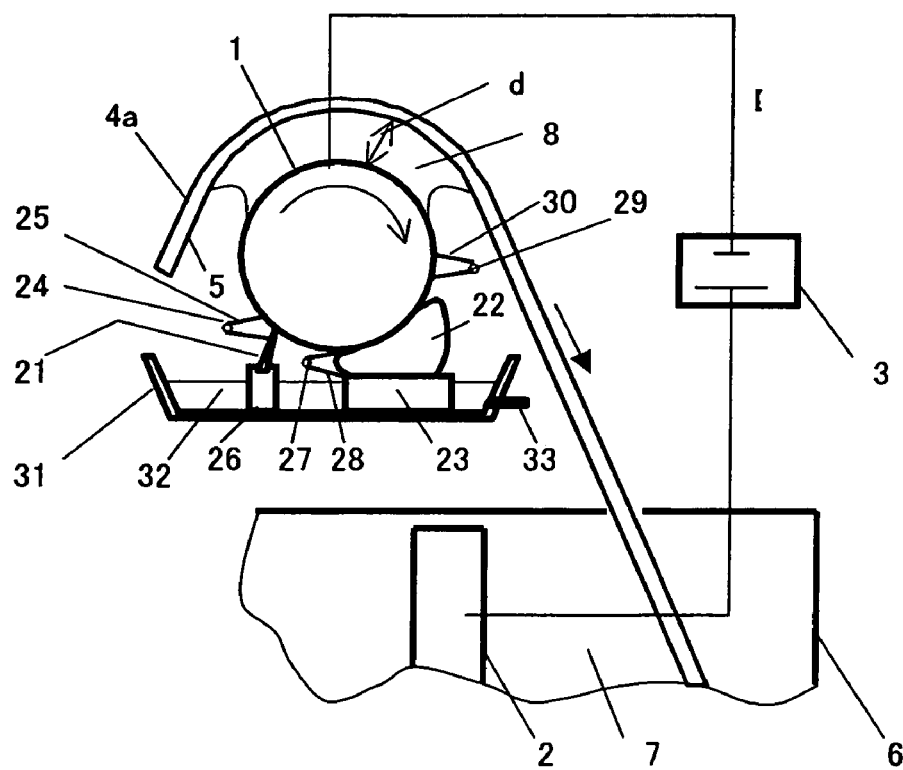
FIG. 4 is a schematic vertical sectional view showing another mode of a cathode roll unit used for carrying out the invention.

FIG. 4 is an enlarged vertical sectional view showing another example of the cathode roll unit used in the plated film production process for carrying out the plated film production method of the invention. The cathode roll unit comprises a cathode roll 1, a liquid receiving pan 31, a doctor blade 21, an elastic body 22, and liquid supply sections 24, 27 and 29.

The function of the cathode roll 1 in the cathode roll unit of FIG. 4 is the same as the function of the cathode roll 1 in the cathode roll unit of FIG. 3. However, the cathode rolls 1 are different each other in the equipment arranged at their bottoms.

In the cathode roll unit of FIG. 4, the doctor blade 21 is provided for removing the deposit adhering to the cathode roll 1, from the cathode roll 1. The doctor blade 21 is supported on a support 26 in such a manner that its tip end may be kept in contact with the surface of the cathode roll 1. The liquid supply section 24 is provided for supplying a liquid 25 to the doctor blade 21.

Furthermore, the elastic body 22 is provided for removing the deposit adhering to the cathode roll 1. The elastic body 22 is supported on a support 23 in such a manner that its upper surface may be kept in contact with the surface of the cathode roll 1. The liquid supply section 27 is provided for supplying a liquid 28 to the elastic body 22.

Moreover, the liquid supply section 29 is provided for supplying a liquid 30 to the cathode roll 1.

Though not shown in the drawing, the supplied amounts of liquids 25, 28 and 30 are strictly controlled individually by means of pumps and valves.

Lest the liquids 25, 28 and 30 should enter the plating bath 6, the receiving pan 31 is provided, and has a discharge port 33 for discharging the received liquid 32.

In FIG. 3, it is necessary that the following relation is satisfied, for preventing that a metal intended to constitute the plating layer is precipitated and deposited on the cathode roll 1.

$$E_0 > [(I/Cs) \times d]/\sigma \qquad (i)$$

where d is the thickness of the gap existing the liquid layer 8 between the cathode roll 1 and the conductive surface 5 of the film 4a; σ is the conductivity of the liquid constituting the liquid layer 8 existing in the gap; I is the value of the current flowing through the cathode roll 1 for plating; Cs is the area of the conductive surface 5 of the film 4a kept in electrical contact with the cathode roll 1 through the liquid layer 8; and $E_0$ is the reduction potential of the metal constituting the plating layer.

Actually the following is desirable. In reference to the electric current condition and the reduction potential $E_0$ of the metal, for the current value I concerned, the relation between the thickness d of the gap chosen as the abscissa and the conductivity σ chosen as the ordinate is graphed as calculated from the formula (i), and any conductivity σ in the range above the line drawn in the graph is used.

The inventors found that even in the case where the film 4a is carried with its conductive surface 5 kept in electrical contact with the cathode roll 1 through the liquid layer 8, if the potential difference between the conductive surface 5 and the cathode roll 1 exceeds the value of the reduction potential $E_0$ of the metal constituting the plating layer, there occurs a phenomenon in which the metal intended to constitute the plating layer is precipitated on the cathode roll 1. The inventors variously examined how to prevent the precipitation phenomenon. As a result, the relation shown by the formula (i) was found.

The method for producing a plated film of the invention is characterized in that at least one of the thickness d of the gap between the cathode roll 1 and the conductive surface 5 of the film 4a, the conductivity σ of the liquid constituting the liquid layer 8 existing in the gap, the value of the current I flowing through the cathode roll 1 for plating, and the area Cs of the conductive surface 5 of the film 4a kept in electrical contact with the cathode roll 1 through the liquid layer 8 is controlled to ensure that the value of $[(I/Cs) \times d]/\sigma$ can be kept less than the value of the reduction potential $E_0$ of the metal constituting the plating layer.

In this case, the phenomenon in which the metal intended to constitute the plating layer is precipitated on the cathode roll 1 can be prevented. In addition, since the liquid layer 8 is interposed between the conductive surface 5 and the cathode roll 1, the carried state of the film 4a can also be kept good.

As the liquid constituting the liquid layer 8, the electrolyte contained in the plating solution 7 can be used. It is preferred that the electrolyte 9 used as the liquid constituting the liquid layer 8 is an electrolyte mainly composed of sulfuric acid, since a metal salt is unlikely to be generated. In the case where the metal constituting the plating layer is copper, it is especially preferred to use an electrolyte mainly composed of sulfuric acid.

For adjusting the conductivity of the electrolyte 9 constituting the liquid layer 8, it is desirable to monitor the conductivity of the supplied electrolyte in the adjusting tank 11, and to use a solution obtained by diluting highly concentrated sulfuric acid using ion exchange water or the like, for adjusting the conductivity. The conductivity of the electrolyte adjusted in conductivity is monitored by means of a high precision conductivity meter. When the conductivity is lower than the desired value, highly concentrated sulfuric acid is supplied into the adjusting tank 11, and when the conductivity is higher than the desired value, ion exchange water is supplied. It is preferred that the adjustment of conductivity is feedback-controlled.

As shown in FIG. 3, the electrolyte 9 adjusted in conductivity supplied from the adjusting tank 11 is collected in the electrolyte accommodating pan 10 positioned below the cathode roll 1. The cathode roll 1 is disposed in relation with the electrolyte accommodating pan 10 to ensure that part of the cathode roll 1 can be kept in contact with or immersed in the electrolyte 9 collected in the electrolyte accommodating pan 10. If the cathode roll 1 is rotated, the electrolyte 9 adhering to the surface of the cathode roll 1 is carried to the region where the liquid layer 8 is formed, and at the region, the liquid layer 8 is formed between the running film 4a and the conductive surface 5 of the cathode roll 1.

In the cathode roll 1 shown in FIG. 4, the liquid 25 is supplied from the liquid supply section 24 to the doctor blade 21. The liquid 25 supplied to the doctor blade 21 is deposited on the surface of the cathode roll 1, and while the cathode roll 1 is rotated, the liquid 25 is carried to the region where the liquid layer 8 is formed, to form the liquid layer 8 there between the conductive surface 5 of the running film 4a and the cathode roll 1.

Furthermore, in the cathode roll 1 shown in FIG. 4, the liquid 28 is supplied from the liquid supply section 27 to the elastic body 22. The liquid 28 supplied to the elastic body 22 is deposited on the surface of the cathode roll 1, and while the cathode roll 1 is rotated, the liquid 28 is carried to the region where the liquid layer 8 is formed, to form the liquid layer 8 there between the conductive surface 5 of the running film 4a and the cathode roll 1.

Still furthermore, in the cathode roll 1 shown in FIG. 4, the liquid 30 is directly supplied from the liquid supply section 29 to the cathode roll 1. The liquid supplied to the cathode roll 1 is deposited on the surface of the cathode roll 1, and while the cathode roll 1 is rotated, the liquid is carried to the region where the liquid layer 8 is formed, to form the liquid layer 8 there between the conductive surface 5 of the running film 4a and the cathode roll 1.

In the cathode roll 1 shown in FIG. 4, at least one of the above-mentioned three methods is used as the method for forming the liquid layer 8. In any of the methods, it is only required that the conductivity of the liquid constituting the liquid layer 8 existing in the gap d basically satisfies the above-mentioned formula (i).

In the actual production control, it is preferred that the conductivity is controlled in a range from 1 mS/cm to 100 mS/cm.

In the case where the conductivity is less than 1 mS/cm, if it is attempted to avoid that the metal intended to constitute the plating layer is precipitated on the cathode roll 1, a low current value must be selected for the applied current. In the production process employing the low current value, the productivity of the plated film 4b declines. Therefore, it is not preferred that the conductivity is less than 1 mS/cm, since productivity cannot be enhanced.

Especially in the case where the metal constituting the plating layer is copper, if the plating apparatus having a size as shown in Example 1 described later is used, a current value of 200 A is the limit at which copper is precipitated on the cathode roll 1 even if the gap d is kept as small as 40 μm. If an area of about 3.2 m×0.52 m is plated using one rectifier, the current density for forming the plating layer in this case can be raised only up to 1.2 A/dm$^2$ at the highest.

In the case where the conductivity is more than 100 mS/cm, the metal is likely to be dissolved out of the formed plating layer. Therefore, it is not preferred that the conductivity is more than 100 mS/cm, since the metal dissolving phenomenon is likely to occur.

The extent of the gap d can be controlled by adjusting the carrying tension of the film 4a. Theoretically, there is the following generally known Hoyle's equation (ii).

$$d = \alpha \times r \times (\beta \mu v / T)^{2/3} \qquad \text{(ii)}$$

where α and β are constants; r is the diameter of the cathode roll 1; μ is the viscosity of the liquid of the liquid layer 8; v is the carrying speed of the film 4a; and T is the carrying tension of the film 4a.

The relation between the gap d and the carrying tension T of the film 4a can be found based on this theoretical equation. However, since there is a relation that the gap d is virtually inversely proportional to the ⅔rd power of the carrying tension T, this relation can be used to control the gap d and the carrying tension T.

Based on the latter method, in the case where the gap d is desired to be adjusted to its ½, it is only required to multiply the carrying tension by $2^{(3/2)} \approx 2.83$. If the gap d is controlled as described above, the production conditions to satisfy the formula (i) can be set.

In the production process, it is preferred that the carrying tension T of the film 4a is kept in a range from 10 N/m to 320 N/m. In the case where the carrying tension T is less than 10 N/m, it can happen that the film 4a sways irregularly in the horizontal direction in the running course of the film 4a. The occurrence of this phenomenon means that the carried state of the film is not successfully controlled in the production process. In the case where the carrying tension T is more than 320 N/m, if the metal of the plating layer formed on the conductive surface 5 of the film 4a is internally strained, there arises a phenomenon that the formed plated film 4b is curled. The occurrence of this phenomenon means that a plated film 4a with good quality cannot be produced.

It is preferred that the extent of the gap d is from 2 μm to 500 μm. If the extent of the gap d is less than 2 μm, chances that the conductive surface 5 of the film 4a directly contacts the cathode roll 1 increase, partly owing to the relation with the surface roughness of the cathode roll 1. If the frequency of direct contact increases, a plated film 4b having good quality cannot be obtained. If the extent of the gap d is more than 500 μm, it can happen that the film 4a sways irregularly in the horizontal direction in the running course of the film 4a. The occurrence of this phenomenon means that the carried state of the film is not successfully controlled in the production process.

The carrying tension T is detected by means of the tension detection roll 325 (FIG. 1). The signal concerning the detected value of the carrying tension T is used to control the film carrying speed of the speed adjusting section 321, for ensuring that the detected value of the carrying tension T can be kept substantially constant, and as a result, control is made to ensure that the value of the carrying tension T becomes substantially constant. It is desirable that the control is feedback control.

The control of the carrying speed of the film 4a in FIG. 1 is such that the cathode rolls 1 are drive rolls, and that the basic speed is set in the speed control section 309. In this control method, the draw ratio acting on the film 4a between the cathode rolls 1-1 and 1-2 can be set. Furthermore, in this control method, the draw ratio between respectively adjacent cathode rolls 1 is set to be gradually higher, and the speed adjusting section 321 controls the final carrying speed of the film 4b. If this control method is employed, the maximum carrying tension Tmax of the film 4a at the cathode rolls 1 positioned above the plating bath 6 occurs at the tension detection roll 325. Therefore, the carrying tension T of the film 4a can be controlled based on the value of the maximum carrying tension Tmax, and it is preferred to do so.

The extent of the gap d is larger when the carrying tension T is smaller. The gap d on the first cathode roll 1-1 at which the carrying tension T is lowest can also be measured to raise or lower the carrying tension T to ensure that the extent of the gap conforms to a target value.

It can sometimes happen that the metal intended to constitute the plating layer is precipitated on the cathode rolls 1. For preventing it, each of the cathode rolls 1 can be provided with a blade 21 for scraping off the precipitated metal. It is preferred that the tip of the blade 21 is inclined in the rotating direction of the cathode roll 1, instead of being directed to be perpendicular to the surface of the cathode roll 1. In this constitution, even if the metal intended to constitute the plating layer should be precipitated on the cathode roll 1, the precipitated metal can be scraped off and removed by the blade 21.

The blade 21 is supported on the support 26. The support 26 has a function of being able to adjust the force of pressing the tip of the blade 21, in the direction perpendicular to the rotating direction of the cathode roll 1 (in the width direction of the cathode roll 1). In this constitution, adjustment can be made to ensure that the force of pressing the tip of the blade 21 to the surface of the cathode roll 1 can be kept uniform in the width direction of the cathode roll 1.

The blade 21 is provided to contact the cathode roll 1. So, it is preferred that the material of the blade 21 is unlikely to cause a metal reaction and is unlikely to cause a cell phenomenon (oxidation-reduction phenomenon) caused due to the existence of the electrolyte at the contact portion. From this point of view, it is preferred that the blade 21 is made of a resin or ceramic. A blade made of a plastic resin can be, for example, plastic blade "E500" produced by EL Japan Co., Ltd., UHMW polyethylene-based blade produced by Eco Blade K.K., or fluorine resin-based TS doctor blade produced by K.K. Tokyo Seisakusho. A blade made of a ceramic can be, for example, SIC new ceramic blade produced by K.K. Tokyo Seisakusho.

The elastic body 22 used for wiping away the metal precipitated on the cathode roll 1 can also be provided in sliding contact with the surface of the cathode roll 1. The elastic body 22 is supported on the support 23. The support 23 has a function of being able to adjust the force of pressing the elastic body 22, in the direction perpendicular to the rotating direction of the cathode roll 1 (in the width direction of the cathode roll 1). In this constitution, adjustment can be made to ensure that the force of pressing the elastic body 22 to the surface of the cathode roll 1 can be kept uniform in the width direction of the cathode roll 1.

The elastic body 22 is composed of a sponge, nonwoven fabric, foam or the like. It is preferred that the material of the elastic body 22 is polyurethane, PVA (polyvinyl alcohol), PVC (polyvinyl chloride), polyethylene, or butyl-based or neoprene-based rubbery material. Among them, PVA (polyvinyl alcohol) and PVC (polyvinyl chloride) are especially preferred, since they are resistant against an electrolyte mainly composed of sulfuric acid and a plating solution.

If the blade 21 and the elastic body 22 are used together, the metal precipitated on the cathode roll 1 can be efficiently removed. For example, the precipitated metal that happened to remain at a portion on the cathode roll 1 due to poor contact of the blade 21 can be wiped away by the elastic body 22.

It is desirable to continuously or intermittently supply the liquid to the cathode roll 1 having a metal precipitated, the blade 21 and the elastic body 22. The liquid washes away the precipitated metal. In this constitution, the precipitated metal can be removed more efficiently. On the other hand, the liquid is used as a method for keeping constant, the conductivity σ of the liquid constituting the liquid layer 8 in the formula (i).

The liquid is supplied, as shown in FIG. 4, from the liquid supply section 24, the liquid supply section 27 or the liquid supply section 29. That is, the liquid 25 is supplied from the liquid supply section 24 to the blade 21, and the liquid 28 is supplied from the liquid supply section 27 to the elastic body 22. Otherwise, the liquid 30 is supplied from the liquid supply section 29 to the cathode roll 1.

As the base film used for producing the plated film, a film formed of a polyimide resin or polyester resin can be preferably used. In the case where a copper-plated film as used for electronic circuit materials is formed, a general purpose polyester resin film can be preferably used as the base film. In the case where solder heat resistance is required for mounting circuit ICs or the like, a polyimide resin film can be preferably used as the base film.

Particular examples of the base film include polyesters such as polyethylene terephthalate, polyethylene-2,6-naphthalate, and polyethylene-α,β-bis(2-chlorophenoxyethane-4,4'-dicarboxylate), polyetheretherketone, aromatic polyamides, polyallylates, polyimides, polyamideimides, polyetherimides, polyoxadiazole, halogen group substitution products and methyl group substitution products of the foregoing, copolymers of the foregoing, and mixtures consisting of the foregoing and other organic polymers. The base film can also contain additives such as a lubricant and a plasticizer.

As the base film, especially preferred is a film improved is in mechanical properties obtained by biaxially stretching a cast film obtained by melt-extruding a polymer containing 85 mol % or more of recurring units represented by the following formulae.

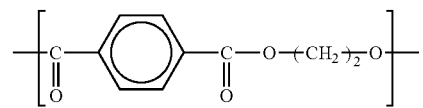

-continued

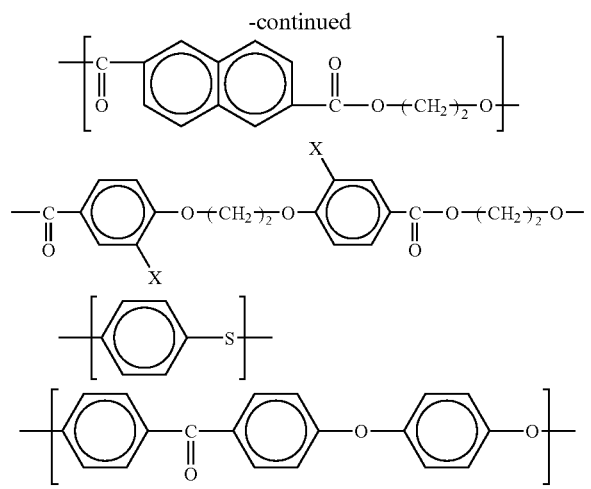

(where X denotes a H, CH$_3$, F or Cl group)

As the base film, also preferred is a film obtained by wet-forming or dry-forming a polymer containing 50 mol % or more of recurring units represented by the following formulae, or a film obtained by biaxially stretching and/or heat-treating the film.

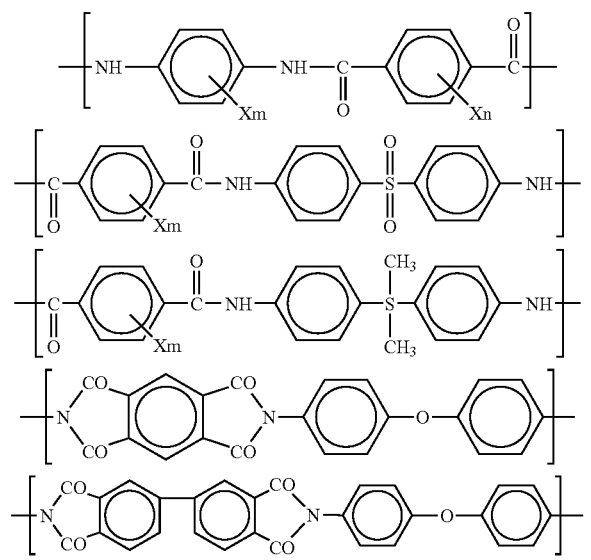

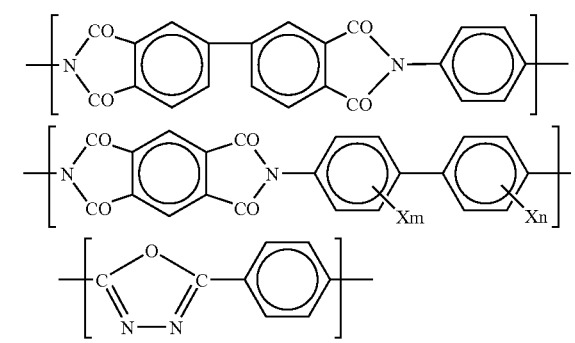

-continued

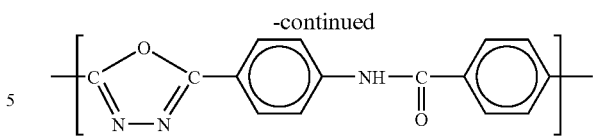

(where X denotes a H, CH$_3$, F or Cl group; and m and n denote, respectively independently, an integer of 0 to 3)

For flexible circuits, base films having a thickness of 6 to 125 μm are often used, and especially base films having a thickness of 12 to 50 μm are suitably used.

It is very difficult to let a wide film having such a thin thickness smoothly run in the plated film production apparatus shown in FIG. 1. It can happen that even if the liquid layer 8 exists between the conductive surface 5 of the film 4a and the cathode roll 1, the film 4a does not run smoothly.

In the case where the surface roughness Rmax of the cathode roll 1 is more than 1 μm, when the carrying tension T is raised, it can happen that the heights of the surface projections existing on the surface of the cathode roll 1 become higher than the thickness d of the interposed liquid layer 8, to cause a phenomenon that the surface projections bite the film 4a. If this phenomenon occurs, the film 4a is gripped by the surface of the cathode roll 1. As a result, the film 4a is locally tensioned, and in response to it, it is also locally loosened.

If this state occurs, the conductive surface 5 of the film 4a or the surface of the plating layer just formed is flawed. Furthermore, there also occurs a problem that the surface roughness of the cathode roll 1 is transferred to the conductive surface 5 of the film 4a.

The cathode roll for plating of the invention solves the problem, by keeping the surface roughness Rmax of the cathode roll at 1 μm or less. If this cathode roll is used, the liquid layer lubrication on the cathode roll is smooth even if the film is thin, and the film can be stably carried through the production apparatus.

However, if the cathode roll is made of ordinary SUS316, intergranular corrosion progresses little by little with the lapse of service time. Furthermore, since the surface hardness is about 70 in Vickers hardness Hv, the surface is gradually worn and flawed due to the friction with the film. As a result, the surface roughness Rmax of 1 μm or less cannot be maintained, and the surface appearance quality of the product declines.

To solve this problem, various methods were examined. As a result, a method of using a material having a hardness higher than that of the metal constituting the plating layer, for forming the surface of the cathode roll was found effective. In this constitution, the increase of the surface roughness Rmax by the wear of the cathode roll can be prevented. The Vickers hardness of copper constituting the plating layer is about 170.

The inventors variously examined a cathode roll having a high Vickers hardness, especially examined the surface treatment. As a result, a surface-treated layer mainly using tungsten was found to be very good. Furthermore, it was found that a surface-treated layer containing 50% or more of tungsten and further containing at least one or more elements selected from chromium, nickel and carbon is preferred. Still furthermore, it was found that a surface-treated layer containing 60 to 80 wt % of tungsten, 15 to 25 wt % of chromium, 1 to 10 wt % of nickel and 1 to 10 wt % of carbon is more preferred. Such a material is resistant against the plating solution mainly composed of sulfuric acid and further containing hydrochloric acid and the like, and is very preferred.

As the surface treatment methods there are PVD methods such as vacuum evaporation method and sputtering method, CVD method, thermal spraying method, ion injection method, plating method, etc. Among them, the surface treatment by a thermal spraying method is preferred, since a very hard layer can be simply produced. Furthermore, a thermal spraying method is preferred, since a thicker layer can be easily formed for allowing the surface roughness to be easily adjusted by a diamond grinder after completion of surface treatment.

Thermal spraying methods include an oxy-fuel spraying method, electric spraying method, flame spraying method such as powder flame spraying method, wire flame spraying method, rod flame spraying method, or detonation flame spraying method, electric arc spraying method, and plasma spraying method. A detonation flame spraying method that allows a compact tungsten carbide-based layer to be formed is very preferred.

Lest the plating solution should erode the base metal, it is preferred that the thickness of the surface-treated layer is 30 µm or more. Furthermore, in view of durability, it is preferred that the thickness of the surface-treated layer is 100 µm or more. Moreover, lest the plating solution should erode inside the sprayed layer, it is preferred that the porosity of the thermally sprayed layer is 2% or less.

If the cathode roll for plating as described above is used, it can be prevented that the film surface is flawed. Furthermore, it can be prevented that an unnatural grip force generated by the cathode roll acts on the film, and the film can be carried stably. As a result of these benefits, a good plating layer can be formed on the film.

Such cathode rolls allow plural films to run in parallel to each other along them. In the case where the cathode rolls are used, even if plural films are made to run side by side simultaneously, it does not happen that random tensions occur with the plural films, and the respective films can be carried well. In a process having a long running course in which the films turn back very often along many cathode rolls and submerged rolls, the cathode rolls of the invention exhibit a very good effect. In this constitution, a large quantity of plated films can be produced in a limited space, and the production efficiency of plated films to have been low can be dramatically enhanced.

EXAMPLES

Examples of the invention are described below. The invention is not limited thereto or thereby. In the following examples, respective properties were measured according to the following methods.

(1) Surface Tension of Plastic Film

The surface tension of a plastic film was measured according to JIS K 6766-1977 (Wet Test Methods for Polyethylene and Polypropylene). When the surface tension was 56 dynes/cm or less, a mixed solution consisting of formamide and ethylene glycol monoethyl ether was used as the standard solution, for measuring the surface tension, and when the surface tension was in a range from 57 to 73 dynes/cm, a mixed solution consisting of water (72.8 dynes/cm) and ethylene glycol (47.7 dynes/cm) was used.

(2) Contact Angle

An ACE contact angle meter produced by Kyowa Interface Science Co., Ltd. was used to measure the contact angle by a liquid droplet method.

(3) Thickness of Sputtered Layer

A surface roughness tester of tracer method was used for measurement. A sample was partially coated with an ink removable by a solvent, before a sputtered layer was formed, and then the sputtered layer was formed, the ink coating being removed for measurement.

(4) Thickness of Plating Layer

A plating layer was partially removed using an etchant, and the level difference was measured using a laser microscope produced by Keyence Corporation.

(5) Conductivity

Conductivity meter CEH-12 produced by Horiba Advanced Techno Co., Ltd. was used for measurement. The measuring method was AC two-electrode method, and a sensor with a measuring range from 0 to 199 mS/cm was used.

(6) Gap Existing Liquid Layer

Figure 6:
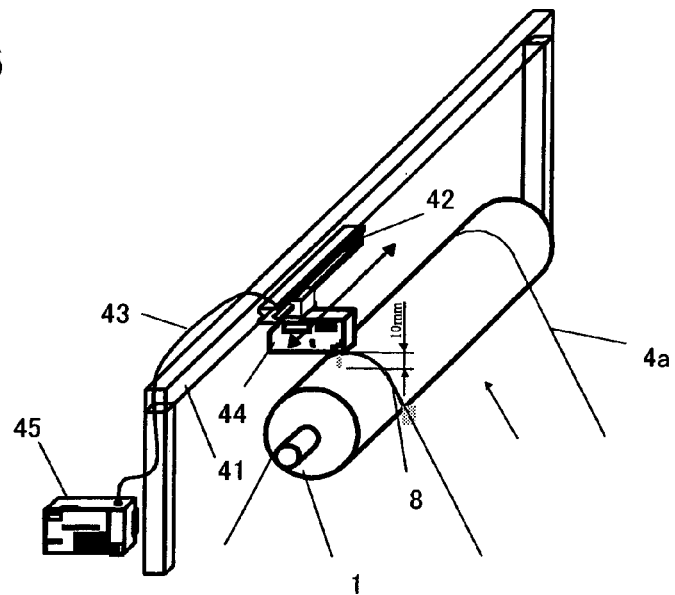
FIG. 6 is a schematic perspective view showing a measuring instrument for measuring the thickness of a liquid layer on a cathode roll.

An instrument shown in FIG. 6 was used to measure the clearance corresponding to the thickness of the liquid layer. In the measuring instrument shown in FIG. 6, a displacement meter 44 having a cable 43 was moved along a slide guide 42 attached to a liquid layer thickness measuring frame 41, and the detected signal was amplified by an amplifier unit 45, for being delivered as an amplified signal. As the measuring sensor (displacement meter 44), a laser displacement meter produced by Keyence Corporation was used for measuring the thickness of the liquid layer. As the sensor head, miniature high precision CCD laser displacement sensor "LK-010" was used, and as the amplifier unit 45, "LK-3100" was used. The sensor had a resolution of 0.1 µm, a spot diameter of 20 µm and a reference distance of 10 mm.

(7) Carrying Tension

On both sides of a cathode roll, load cell type sensors were attached for measurement. The sensors were Model "C2G1-25K" produced by Minebea Co., Ltd. The range in which measurement could be made was from 0 to 250 N. The tension value obtained based on the weight of the roll and the carried film contact angle was corrected.

Figure 8:
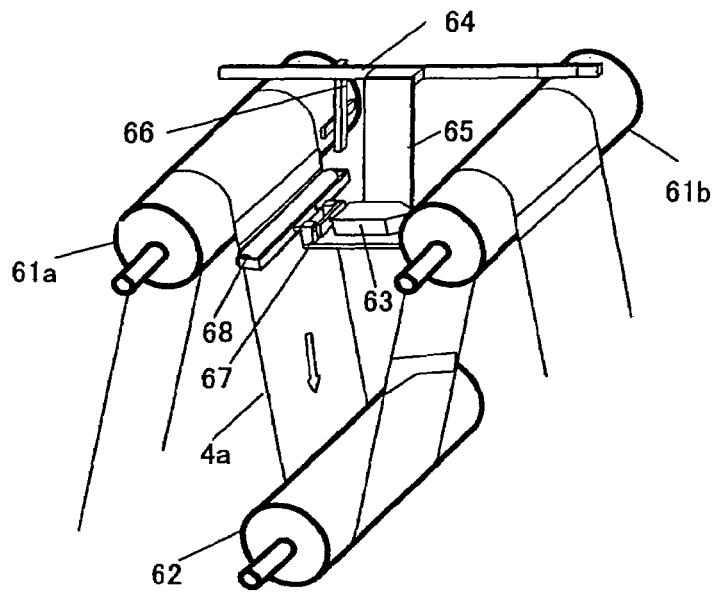
FIG. 8 is a schematic perspective view showing a measuring instrument for measuring the tensions of the films in Examples 3 and 4.

The carrying tension during production was measured using the measuring instrument shown in FIG. 8 as a simple method. A film 4a was spread along a cathode roll 61a, a carrier roll 62 and a cathode roll 61b, for being carried. A push-pull gauge 63 was installed on a slide unit 65 attached to a slide guide 64, and a film-pressing roll 68 was pressed against the film 4a. A stopper 66 was disposed such that when the film-pressing roll 68 was pressed in by 15 mm, the slide stopped. With the roll 68 pressed in by 15 mm while the film 4a was running, the force received from the carried film 4a was measured using the push-pull gauge 63. The push-pull gauge 63 used was "Model 9550" produced by Aikoh Engineering Co., Ltd.

(8) Surface Roughness

A three-dimensional surface roughness tester of tracer method was used for measurement.

Example 1

In this example, a copper-plated film was applied to flexible circuit boards.

(1) Production of a Film Having a Conductive Surface

While a film was unwound from a film roll, it was treated in a pressure reducing device, and subsequently wound into a film roll. In this apparatus, plasma treatment, the formation of a nickel chromium layer, and the formation of a copper layer were performed.

A roll of 25 µm thick, 520 mm wide and 12,500 m long polyimide film "Kapton" 1 (registered trademark of Du Pont, USA) was pre-arranged.

One surface of the film was treated with glow discharge plasma of argon gas at a speed of 2 m/min. For the treatment, the film was carried with a distance of 2 cm kept against a rod electrode to which a high voltage was applied, and a plasma apparatus of internal electrode system having an electrode pair as earthed electrodes was used. The film was treated at an argon gas pressure of 2.5 Pa, a primary output voltage of 2 kV, a high-frequency power supply frequency of 110 kHz and at a speed of 2 m/min, to form a glow discharge plasma layer. The surface tension of the treated film was more than 70 dynes/cm, and the contact angle was 43 degrees.

Then, at an argon gas pressure of $2.6 \times 10^{-6}$ Pa, a 30 nm nickel chromium layer was formed using a target consisting of 20 wt % of chromium and 80 wt % of nickel by applying a DC magnetron sputtering method. Then, a 100 nm copper layer was formed using a target consisting of copper having purity of 99.99 wt % by a DC magnetron sputtering method.

From the film, the testing portion for forming the sputtering layers and the lead portion were removed to produce a 12,000 m film having sputtered layers.

(2) Formation of a Plating Layer

The obtained 12,000 m film roll having sputtered layers was divided into four 3,000 m rolls, to prepare four 520 mm×3,000 m film rolls respectively having a conductive surface. One of them was passed through the following plating apparatus, to form a plating layer.

As the plating apparatus, the apparatus shown in FIGS. 1 and 3 was used. Copper was used as the anodes 2. Sixteen units, each of which was the unit 6a surrounded by the one-dot-dash line of FIG. 2, were used to constitute a plating circuit and a plating apparatus. A film 4b having an 8 μm thick copper plating layer was produced.

Each of the cathode rolls 1 was a SUS316 cylinder having a diameter of 210 mm, a length of 800 mm and a wall thickness of 10 mm. When the film 4a was passed from the cathode roll 1-1 along the submerged roll 101-1 to the cathode roll 1-2, the film pass length was 4 m. The pass length refers to the length of the film 4a from the vertex of the cathode roll 1 to the vertex of the next cathode roll. Therefore, the total pass length of the plating section was 64 m.

The pretreatment conditions, plating conditions and rust preventive treatment conditions of the film are shown in Table 1. The current density for copper plating was set to ensure that the current density gradually rose with increase in the number of passes along the cathode roll 1 and the submerged roll 101. The currents set for the respective rectifiers 3 of the first to sixteenth units were as shown in Table 2.

Figure 5:
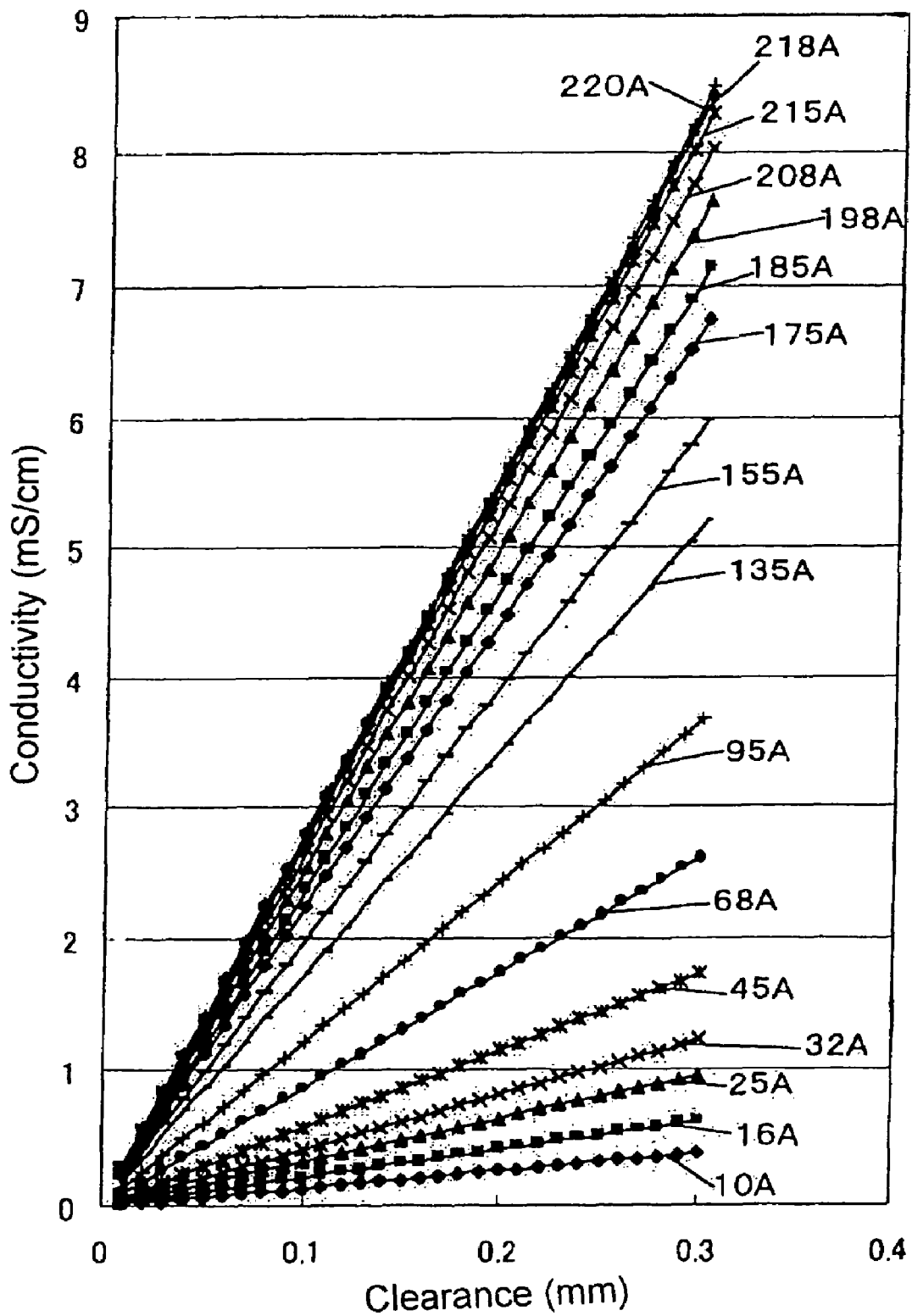
FIG. 5 is a graph showing the relationships between gaps and conductivities at respective current values applied to respective rectifiers.

The relation between the gap d existing the liquid layer and the conductivity σ calculated from the formula (i) for each current value in reference to the current values of Table 2 and the reduction potential of copper of 0.337 V is expressed as a graph in FIG. 5. It is only required that the conductivity is controlled such that it is located above the line indicating the current value concerned in the graph of FIG. 5. The reduction potential of copper changes depending on the activity or concentration of Cu ions, but the value of $Cu^{2+}/Cu$ as the standard unit electrode potential of copper is 0.337 V. Judging from the concentration of copper ions, the potential is smaller than this value. So, this value is employed as the reduction potential. Furthermore, the contact area between the conductive surface 5 of the film 4a and the cathode roll 1 was calculated to be 520 mm wide×about 220 mm, since the contact angle was set at 120 degrees.

The clearance d corresponding to the thickness of the liquid layer was measured using the laser displacement meter 44 as shown in FIG. 6, and the film carrying tension T was set to ensure that the clearance d became 300 μm or less. For setting the film tension, the tension was adequately reduced using the S-shaped lap speed control section 309 shown in FIG. 1, and then, the rotating speed of each roll was changed one after another, for drawing the film at different ratios between the respectively adjacent rolls, thereby setting the respective tensions. At the cathode roll (tension detection roll) 325, the pressure was automatically detected using a load cell, and the speed of the drive motor of the speed adjusting section 321 was used for feedback control to ensure that the tension at the cathode roll 325 became 160 N/m. The clearance d corresponding to the thickness of the liquid layer at the cathode roll 1-1 at which the tension was lowest was measured by the detecting instrument of FIG. 6, and found to be 125 μm.

The carrying speed was set at 1 m/min, and the draw ratio was set stepwise when the drive forces of the motors of the respective cathode rolls 1-1 through 1-17 were set, to gradually raise the speed and to gradually raise the tension.

Control can be made in such a manner that the conductivity may be different at each of the units 6a, but in this case, the apparatus becomes expensive. So, adjustment was made to keep the conductivity of the liquid layer at 10 mS/cm in all of the units 6a, to ensure that the copper precipitation limit should not be exceeded. The sulfuric acid concentration of the adjusting tank 11 in FIG. 3 was adjusted, and the pump 14 was set to achieve 100 ml/min, for controlling the liquid concentration in the receiving pan 10.

As a result, copper was not precipitated on the surfaces of the cathode rolls 1, and the carried state was very stable. A roll film 4b having a good winding style was obtained.

Later, the surface of plating copper was observed. The plating surface had few abnormal projections and depressions, and it was confirmed that a copper-plated film having excellent surface appearance quality could be produced. The numbers of abnormal projections and depressions are shown in Table 3.

(3) Formation of Patterned Circuits

The film was coated with a photosensitive liquid resist and exposed to ultraviolet light using a mask of a circuit pattern having 1,024 copper wires having a wire width of 30 μm at 30 μm wire intervals, i.e., at a wire pitch of 60 μm, then being developed. Ferric chloride was used as an etchant for forming patterned circuits. Fifty such patterned circuits were observed using a stereomicroscope with a magnification of 150×, and the quality of the patterned circuits was judged in reference to chipping (a chip of 10 μm or more was identified as a defect, and a patterned circuit having even one of 1,024 wires defectively chipped was rejected) and wire breaking. The result is shown in Table 4. The patterned circuits showed a yield of 100%.

TABLE 1

| Process | Condition | |
|---|---|---|
| 1. Degreasing | Eisui Clean A110 | 30 g/l |
| | Temperature | 50° C. |
| | Time | 2 min. |
| 2. Acid activity | Sulfuric acid | 10 ml/l |
| | Temperature | 30° C. |
| | Time | 0.5 min. |
| 3. Cathode treatment | Copper sulfate | 30 g/l |
| | Sulfuric acid | 150 g/l |
| | Brightening agent (Ebara-Udylite) | 3 ml/l |
| | Temperature | 25° C. |
| | Time | 2 min. |
| | Current density | 0.5 A/dm$^2$ |
| 4. Copper plating | Copper sulfate | 200 g/l |
| | Sulfuric acid | 50 g/l |
| | Metal copper | 50 g/l |
| | Brightening agent (Ebara-Udylite) | 2 ml/l |
| | Chlorine | 60 mg/l |

TABLE 1-continued

| Process | Condition | |
|---|---|---|
| | Temperature | 30° C. |
| | Time (thickness: 10μ) | 20 min. |
| | Current density | 0.5 → 3 A/dm$^2$ |

TABLE 2

| Rectifier No. | Set current value |
|---|---|
| 3-1 | 10 A |
| 3-2 | 16 A |
| 3-3 | 25 A |
| 3-4 | 32 A |
| 3-5 | 45 A |
| 3-6 | 68 A |
| 3-7 | 95 A |
| 3-8 | 135 A |
| 3-9 | 155 A |
| 3-10 | 175 A |
| 3-11 | 185 A |
| 3-12 | 198 A |
| 3-13 | 208 A |
| 3-14 | 215 A |
| 3-15 | 218 A |
| 3-16 | 220 A |
| Total | 2,000 A |

TABLE 3

Number of projections and depressions in 520 mm × 100 mm

| Maximum diameter of projections and depressions | Example 1 | Example 2 | Comparative Example 1 | Comparative Example 2 |
|---|---|---|---|---|
| 3 to 10 μm | 2 | 5 | >100 | — |
| 11 to 50 μm | 3 | 4 | 56 | — |
| 51 to 100 μm | 0 | 0 | 32 | — |
| 101 μm or more | 0 | 0 | 8 | — |

TABLE 4

| | Example 1 | Example 2 | Comparative Example 1 | Comparative Example 2 |
|---|---|---|---|---|
| Number of acceptable circuits | 50 | 50 | 3 | — |
| Circuits/50 circuits | 100% | 100% | 6% | — |

Example 2

In this example, a copper-plated film was applied to flexible circuit boards.

(1) Production of a Film Having a Conductive Surface

Quite the same film having a conductive surface as that of Example 1 was produced.

(2) Formation of a Plating Layer

The obtained 12,000 m film roll having sputtered layers was divided into four 3,000 m rolls, to prepare four 520 mm×3,000 rolls. One of them was passed through the following plating apparatus, to form a plating layer.

As the plating apparatus, the apparatus shown in FIGS. 1 and 4 was used. Copper was used as the anodes 2. Sixteen units, each of which was the unit 6a surrounded by the one-dot-dash line of FIG. 2, were used to constitute a plating circuit and a plating apparatus. A film 4b having an 8 μm thick copper plating layer was produced.

Each of the cathode rolls 1 was a SUS316 cylinder having a diameter of 210 mm, a length of 800 mm and a wall thickness of 10 mm. When the film 4a was passed from the cathode roll 1-1 along the submerged roll 101-1 to the cathode roll 1-2, the film pass length was 4 m. The pass length refers to the length of the film 4a from the vertex of the cathode roll 1 to the vertex of the next cathode roll. Therefore, the total pass length of the plating section was 64 m.

The pretreatment conditions, plating conditions and rust preventive treatment conditions of the film are shown in Table 1. The current density for copper plating was set to ensure that the current density gradually rose with increase in the number of passes along the cathode roll 1 and the submerged roll 101. The currents set for the respective rectifiers 3 of the first to sixteenth units were as shown in Table 2.

The relation between the clearance d corresponding to the thickness of the liquid layer and the conductivity σ calculated from the formula (i) for each current value in reference to the current values of Table 2 and the reduction potential of copper of 0.337 V is expressed as a graph in FIG. 5. It is only required that the conductivity is controlled such that it is located above the line indicating the current value concerned in the graph of FIG. 5. The reduction potential of copper changes depending on the activity or concentration of Cu ions, but the value of $Cu^{2+}/Cu$ as the standard unit electrode potential of copper is 0.337 V. Judging from the concentration of copper ions, the potential is smaller than this value. So, this value is employed as the reduction potential. Furthermore, the contact area between the conductive surface 5 of the film 4a and the cathode roll 1 was calculated to be 520 mm widexabout 220 mm, since the contact angle was set at 120 degrees.

The clearance d corresponding to the thickness of the liquid layer was measured using the laser displacement meter 44 as shown in FIG. 6, and the film carrying tension T was set to ensure that the clearance d became 300 μm or less. For setting the film tension, the tension was adequately reduced using the S-shaped lap speed control section 309 shown in FIG. 1, and then, the rotating speed of each roll was changed one after another, for drawing the film at different ratios between the respectively adjacent rolls, thereby setting the respective tensions. At the cathode roll (tension detection roll) 325, the pressure was automatically detected using a load cell, and the speed of the drive motor of the speed adjusting section 321 was used for feedback control to ensure that the tension at the cathode roll 325 became 160 N/m. The clearance d corresponding to the thickness of the liquid layer at the cathode roll 1-1 at which the tension was lowest was measured by the detecting instrument of FIG. 6, and found to be 80 μm.

The carrying speed was set at 1 m/min, and the draw ratio was set stepwise when the drive forces of the motors of the respective cathode rolls 1-1 through 1-17 were set, to gradually raise the speed and to gradually raise the tension.

Control can be made in such a manner that the conductivity may be different at each of the units 6a, but in this case, the apparatus becomes expensive. So, adjustment was made to keep the conductivity of the liquid layer at 2 mS/cm in all of the units 6a, to ensure that the copper precipitation limit should not be exceeded. That is, sulfuric acid was used as the liquid 25 for washing the doctor blade 21 in FIG. 4, and its conductivity was set at 2 mS/cm. A shower was supplied for 2 seconds every three minutes, to ensure that 200 ml of the liquid 25 was supplied every two minutes. Furthermore, sulfuric acid was used as the liquid 27 supplied to the elastic body 22, and its conductivity was set at 2 mS/cm. A shower was supplied for 2 seconds every three minutes, to ensure that 200 ml of the liquid 27 was supplied every 2 minutes. In this sequence, one minute after sulfuric acid was showered to the doctor blade 21, the liquid 27 was supplied. Moreover, sulfuric acid was supplied as the liquid 30 supplied to the cathode roll 1, and its conductivity was set at 2 mS/cm. A shower was supplied for 2 seconds every three minutes, to ensure that 200 ml of the liquid 30 was supplied every 2 minutes. In this sequence, one minute after sulfuric acid was showered to the elastic body 22, the liquid 30 was supplied. In this way, the concentration of the liquid constituting the liquid layer 8 was controlled.

Portions that did not satisfy the formula (i) were formed due to the relation between the clearance d corresponding to the thickness of the liquid layer and the conductivity σ, and when the film 4a left from each of the cathode rolls 1, the copper precipitated on the cathode roll 1 was observed. However, the precipitated copper was removed by the blade 21 and the elastic body 22, and it was confirmed that when the portion faced the film 4a next, it was in a clean state.

Even if copper was precipitated temporarily on the surfaces of the cathode rolls 1, it was immediately removed. So, the film 4a was not damaged, and could be carried stably. The copper-plated film 4b could be produced as a roll film having good winding style.

The blades 21 used were plastic blades E500 produced by EL Japan Co., Ltd. The sponge of the elastic body 22 was made of PVA, and it was uniformly pressed against the cathode roll 1, to ensure that the pressing pressure became 50 N/m.

Later, the surface of copper plating was observed, and the surface of the plating had few abnormal projections and depressions, and it was confirmed that a copper-plated film with excellent surface appearance quality could be produced. The numbers of abnormal projections and depressions are shown in Table 3.

(3) Formation of Patterned Circuits

The film was coated with a photosensitive liquid resist and exposed to ultraviolet light using a mask of a circuit pattern having 1,024 copper wires having a wire width of 30 μm at 30 μm wire intervals, i.e., at a wire pitch of 60 μm, then being developed. Ferric chloride was used as an etchant for forming patterned circuits. Fifty such patterned circuits were observed using a stereomicroscope with a magnification of 150×, and the quality of the patterned circuits was judged in reference to chipping (a chip of 10 μm or more was identified as a defect, and a patterned circuit having even one of 1,024 wires defectively chipped was rejected) and wire breaking. The result is shown in Table 4. The patterned circuits showed a yield of 100%.

Comparative Example 1

In this comparative example, a copper-plated film was applied to flexible circuit boards.

(1) Production of a Film Having a Conductive Surface

Quite the same film having a conductive surface as that of Example 1 was produced.

(2) Formation of a Plating Layer

The obtained 12,000 m film roll having sputtered layers was divided into four 3,000 m rolls, to prepare four 520 mm×3,000 m film rolls respectively having a conductive surface. One of them was passed through the following plating apparatus, to form a plating layer.

As the plating apparatus, the apparatus shown in FIGS. 1 and 3 was used. Copper was used as the anodes 2. Sixteen units, each of which was the unit 6a surrounded by the one-dot-dash line of FIG. 2, were used to constitute a plating circuit and a plating apparatus. A film 4b having an 8 μm thick copper plating layer was produced.

Each of the cathode rolls 1 was a SUS316 cylinder having a diameter of 210 mm, a length of 800 mm and a wall thickness of 10 mm. When the film 4a was passed from the cathode roll 1-1 along the submerged roll 101-1 to the cathode roll 1-2, the film pass length was 4 m. The pass length refers to the length of the film 4a from the vertex of the cathode roll 1 to the vertex of the next cathode roll. Therefore, the total pass length of the plating section was 64 m.

The pretreatment conditions, plating conditions and rust preventive treatment conditions of the film are shown in Table 1. The current density for copper plating was set to ensure that the current density gradually rose with increase in the number is of passes along the cathode roll 1 and the submerged roll 101. The currents set for the respective rectifiers 3 of the first to sixteenth units were as shown in Table 2.

The clearance d corresponding to the thickness of the liquid layer was measured using the laser displacement meter 44 as shown in FIG. 6, and the film carrying tension T was set to ensure that the clearance d became 300 μm or less. For setting the film tension, the tension was adequately reduced using the S-shaped lap speed control section 309 shown in FIG. 1, and then, the rotating speed of each roll was changed one after another, for drawing the film at different ratios between the respectively adjacent rolls, thereby setting the respective tensions. At the cathode roll (tension detection roll) 325, the pressure was automatically detected using a load cell, and the speed of the drive motor of the speed adjusting section 321 was used for feedback control to ensure that the tension at the cathode roll 325 became 160 N/m. The clearance d corresponding to the thickness of the liquid layer at the cathode roll 1-1 at which the tension was lowest was measured by the detecting instrument of FIG. 6, and found to be 125 μm.

The carrying speed was set at 1 m/min, and the draw ratio was set stepwise when the drive forces of the motors of the respective cathode rolls 1-1 through 1-17 were set, to gradually raise the speed and to gradually raise the tension.

Ion exchange water was placed in the adjusting tank 11 of FIG. 3, and the pump 14 was set to achieve 100 ml/min, for supplying into the receiving pan. The conductivity of the electrolyte in the receiving pan 10 in this case was 0.02 mS/cm.

As a result, the cathode rolls in the former half of carrying were lightly colored like copper on their surfaces, and the 6th to 14th cathode rolls had copper precipitated and were colored like copper on their surfaces. In the beginning, the carried state was stable, but after some cathode rolls began to have copper precipitated, the carried state became gradually unstable, causing the film to be gripped on the cathode rolls. The film became tensioned and deflected, and being affected by the stirring air in the liquid, the film began to sway irregularly in the horizontal direction, and was wrinkled on the cathode rolls. Furthermore, since the copper-plated film had large stiffness, creases were also observed.

Later, the surface of copper plating was observed. The film could not be used as a product because of the creases, and even in some places free from creases, numerous abnormal projections of 100 μm in major axis and 60 μm in height were formed here and there in the film carrying direction. The numbers of abnormal projections and depressions are shown in Table 3.

(3) Formation of Patterned Circuits

The film was coated with a photosensitive liquid resist and exposed to ultraviolet light using a mask of a circuit pattern having 1,024 copper wires having a wire width of 30 µm at 30 µm wire intervals, i.e., at a wire pitch of 60 µm, then being developed. Ferric chloride was used as an etchant for forming patterned circuits. Fifty such patterned circuits were observed using a stereomicroscope with a magnification of 150×, and the quality of the patterned circuits was judged in reference to chipping (a chip of 10 µm or more was identified as a defect, and a patterned circuit having even one of 1,024 wires defectively chipped was rejected) and wire breaking. The result is shown in Table 5. The patterned circuits showed a yield of 6%, and few normal patterned circuits could be obtained.

Comparative Example 2

In this comparative example, a copper-plated film was applied to flexible circuit boards.

(1) Production of a Film Having a Conductive Surface

Quite the same film with a conductive surface as that of Example 1 was produced.

(2) Formation of a Plating Layer

The obtained 12,000 m film roll having sputtered layers was divided into four 3,000 m rolls, to prepare four 520 mm×3,000 m film rolls respectively with a conductive surface. One of them was passed through the following plating apparatus, to form a plating layer.

As the plating apparatus, the apparatus shown in FIGS. 1 and 3 was used. Copper was used as the anodes 2. Sixteen units, each of which was the unit 6a surrounded by the one-dot-dash line of FIG. 2, were used to constitute a plating circuit and a plating apparatus. A film 4b having an 8 µm thick copper plating layer was produced.

Each of the cathode rolls 1 was a SUS316 cylinder having a diameter of 210 mm, a length of 800 mm and a wall thickness of 10 mm. When the film 4a was passed from the cathode roll 1-1 along the submerged roll 101-1 to the cathode roll 1-2, the film pass length was 4 m. The pass length refers to the length of the film 4a from the vertex of the cathode roll 1 to the vertex of the next cathode roll. Therefore, the total pass length of the plating section was 64 m.

The pretreatment conditions, plating conditions and rust preventive treatment conditions of the film are shown in Table 1. The current density for copper plating was set to ensure that the current density gradually rose with increase in the number of passes along the cathode roll 1 and the submerged roll 101. The currents set for the respective rectifiers 3 of the first to sixteenth units were as shown in Table 2.

The clearance d corresponding to the thickness of the liquid layer was measured using the laser displacement meter 44 as shown in FIG. 6, and the film carrying tension T was set to ensure that the clearance d became 50 µm or less. For setting the film tension, the tension was adequately reduced using the S-shaped lap speed control section 309 shown in FIG. 1, and then, the rotating speed of each roll was changed one after another, for drawing the film at different ratios between the respectively adjacent rolls, thereby setting the respective tensions. At the cathode roll (tension detection roll) 325, the pressure was automatically detected using a load cell, and the speed of the drive motor of the speed adjusting section 321 was used for feedback control to ensure that the tension at the cathode roll 325 became 320 N/m.

The carrying speed was set at 1 m/min, and the draw ratio was set stepwise when the drive forces of the motors of the respective cathode rolls 1-1 through 1-17 were set, to gradually raise the speed and to gradually raise the tension. When the film 4a was carried, no liquid was supplied from the adjusting tank 11 of FIG. 3.

As a result, the cathode rolls in the former half of carrying were lightly colored like copper on their surfaces, and the 6th to 14th cathode rolls had copper precipitated and were colored like copper. In the beginning, the film could be carried, but with the increase in the tension of the film 4a, the film 4a was kept tensioned for a certain period of time, and creased, then being fractured.

As can be seen from the above-mentioned examples and comparative examples, especially from the surface defects of the products shown in Table 3, the plated films produced according to the method of the invention had very excellent appearance quality. The plated films produced according to the method of the invention can be preferably used for producing flexible circuit boards required to have fine pitch circuits formed.

The cathode roll for plating of the invention is described below in reference to particular examples.

To select a material resistant against the plating solution, the resistance of materials against the plating solution was examined. As a result, it was very difficult to find a material having both conductivity and the resistance against the plating solution.

Several milliliters of the plating solution shown in Table 1 was dropped using a dropping pipette, and every day, the dropped plating solution was wiped away, to observe the resistance with eyes. A material not resistant was discolored on the surface. This work was continued for 2 weeks. The results obtained after lapse of 2 weeks are shown in Table 6. Table 6 shows the examined materials and their properties. As shown in Table 6, materials mainly composed of tungsten, above all those containing a predetermined amount of chromium and other elements showed excellent plating solution resistance.

Example 3

In this example, plated films were applied to flexible circuit boards.

(1) Production of a Film Having a Conductive Surface

While a film was unwound from a film roll, it was treated in a pressure reducing device, and subsequently wound into a film roll. In this apparatus, plasma treatment, formation of a nickel chromium layer, and formation of a copper layer were performed.

A roll of 25 µm thick, S20 mm wide and 12,500 m long polyimide film "Kapton" 1 (registered trademark of Du Pont, USA) was prearranged.

One surface of the film was treated with glow discharge plasma of argon gas at a speed of 2 m/min. For the treatment, the film was carried with a distance of 2 cm kept against a rod electrode to which a high voltage was applied, and a plasma apparatus of internal electrode system having an electrode pair as earthed electrodes was used. The film was treated at an argon gas pressure of 2.5 Pa, a primary output voltage of 2 kV, a high-frequency power supply frequency of 110 kHz and at a speed of 2 m/min, to form a glow discharge plasma layer. The surface tension of the treated film was more than 70 dynes/cm, and the contact angle was 43 degrees.

Then, at an argon gas pressure of $2.6 \times 10^{-6}$ Pa, a 30 nm nickel chromium layer was formed using a target consisting of 20% of chromium and 80% of nickel by applying a DC magnetron sputtering method. Then, a 100 nm copper layer was formed using a target consisting of copper having purity of 99.99 wt % by a DC magnetron sputtering method.

From the film, the testing portion for forming the sputtering layers and the lead portion were removed to produce a 12,000 m film with sputtered layers.

(2) Formation of a Plating Layer

The obtained 12,000 m film roll having sputtered layers was divided into four 3,000 m rolls, to prepare four 520 mm×3,000 m film rolls respectively with a conductive surface. Two of them were passed through the following plating apparatus, to form a plating layer.

As the plating apparatus, the apparatus shown in FIG. 1 was used. Copper was used as the anodes 2. Sixteen units, each of which was the unit 6a surrounded by the one-dot-dash line of FIG. 2, were used to constitute a plating circuit and a plating apparatus. A film 4b having an 8 μm thick copper plating layer was produced.

Each of the cathode rolls 1 was a SUS316 cylinder having a diameter of 210 mm, a length of 1,500 mm and a wall thickness of 10 mm. The cathode rolls 1 were treated on their surfaces by the thermal spraying treatment corresponding to surface treatment No. 8 shown in Table 6. The thickness of the surface treatment layer was 200 μm, and the surface roughness was 0.4 μm as Rmax. The cathode rolls 1 were 0.05 mm or less in the out of roundness, 0.08 mm or less in cylindricity, and 0.08 mm or less in the run-out in the circumferential direction. The Vickers hardness Hv of the surfaces was 1,000.

When the film 4a was passed from the cathode roll 1-1 along the submerged roll 101-1 to the cathode roll 1-2, the film pass length was 4 m. The pass length refers to the length of the film 4a from the vertex of the cathode roll 1 to the vertex of the next cathode roll. Therefore, the total pass length of the plating section was 64 m.

The pretreatment conditions, plating conditions and rust preventive treatment conditions of the film are shown in Table 1. The current density for copper plating was set to ensure that the current density gradually rose with increase in the number of passes along the cathode roll 1 and the submerged roll 101. The currents set for the respective rectifiers 3 of the first to sixteenth units were as shown in Table 5.

TABLE 5

| Rectifier No. | Set current value |
|---|---|
| 3-1 | 20 A |
| 3-2 | 32 A |
| 3-3 | 50 A |
| 3-4 | 64 A |
| 3-5 | 90 A |
| 3-6 | 136 A |
| 3-7 | 190 A |
| 3-8 | 270 A |
| 3-9 | 310 A |
| 3-10 | 350 A |
| 3-11 | 370 A |
| 3-12 | 396 A |
| 3-13 | 416 A |
| 3-14 | 430 A |
| 3-15 | 436 A |
| 3-16 | 440 A |
| Total | 4,000 A |

TABLE 6

| Surface treatment No. | Material/Surface treatment method | Vickers hardness, Hv | Plating solution resistance |
|---|---|---|---|
| 1 | Hard chromium/plating treatment | 2,000 | E |
| 2 | NiP-based/Plating treatment | 1,700 | E |
| 3 | TiN/PVD treatment | 2,000 | E |
| 4 | CrN/PVD treatment | 2,100 | E |
| 5 | TiCr/PVD treatment | 2,100 | E |
| 6 | W, Co, Cr, C-based/Thermal spraying treatment | 1,000 | C |
| 7 | Cr-based/Thermal spraying treatment | 950 | C |
| 8 | W(70%), Cr(19%), Ni(5%), C(6%)-based/Thermal spraying treatment | 1,000 | A |
| 9 | W(67%), Cr(20%), Ni(7%), C(6%)-based/Thermal spraying treatment | 1,150 | B |
| 10 | W, Co, Cr, C-based/Thermal spraying treatment | 1,270 | D |
| 11 | Co, Mo, Cr, Si-based/Thermal spraying treatment | 750 | D |
| 12 | Carburizing treatment | 1,100 | E |
| 13 | Carbonitriding treatment | 1,250 | E |
| 14 | SUS316/Hardening treatment | 300 | C |

Meanings of the symbols in the table.
A: No change after lapse of two months
B: Slightly discolored after lapse of one month
C: Slightly discolored after lapse of one week
D: Slightly discolored after lapse of one day
E: Immediately discolored For setting the film tension, the tension was adequately reduced using the S-shaped lap speed control section 309 shown in FIG. 1, and then, the rotating speed of each roll was changed one after another, for drawing the film at different ratios between the respectively adjacent rolls, thereby setting the respective tensions. At the cathode roll (tension detection roll) 325, the pressure was automatically detected using each load cell, and the speed of the drive motor of the speed adjusting section 321 was used for feedback control to ensure that the tension at the cathode roll 325 became 240 N/m.

The carrying tension on each cathode roll 1 was measured using the simple tension measuring instrument shown in FIG. 8. The tension measuring instrument of FIG. 8 can measure the tension acting on a 520 mm wide film.

The carrying speed was set at 1 m/min, and the draw ratio was set stepwise when the drive forces of the motors of the respective cathode rolls 1-1 through 1-17 were set, to gradually raise the speed and to gradually raise the tension.

The two films 4a were made to run in parallel to each other along the respective cathode rolls 1. The carried state of the two films was very stable.

Figure 9:
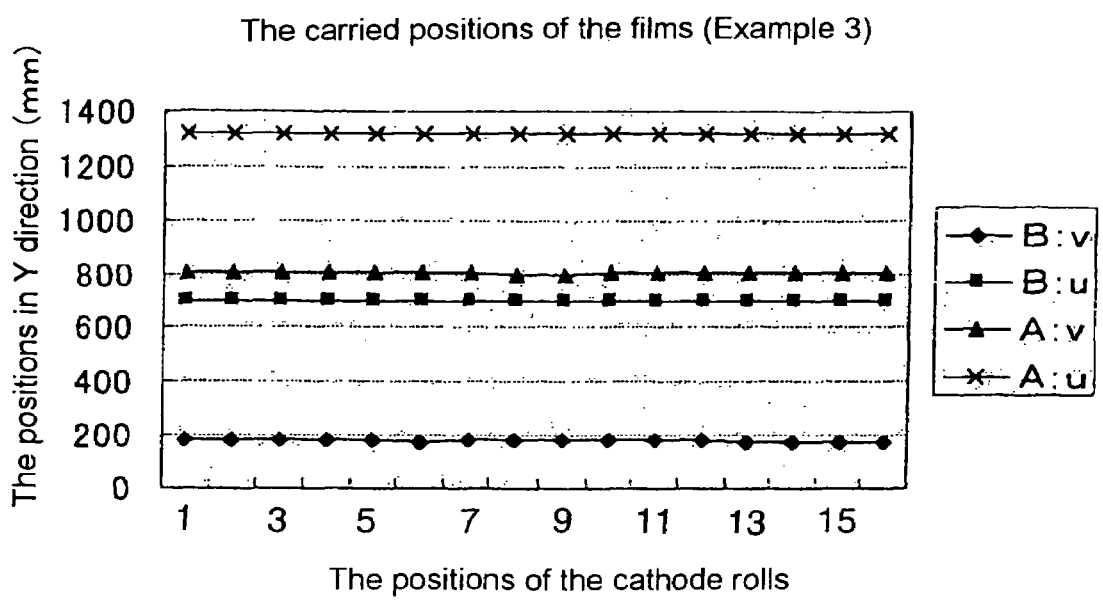
FIG. 9 is a graph showing the carried positions of the films in Example 3.

The two 3,000 m long films 4a were carried, and the carried positions of 180 minutes after start of carrying are plotted as a graph shown in FIG. 9. The plan view of the plating bath section 303 of FIG. 1 in the state where the two films 4a-1 and 4a-2 were carried is shown in FIG. 7.

Figure 7:
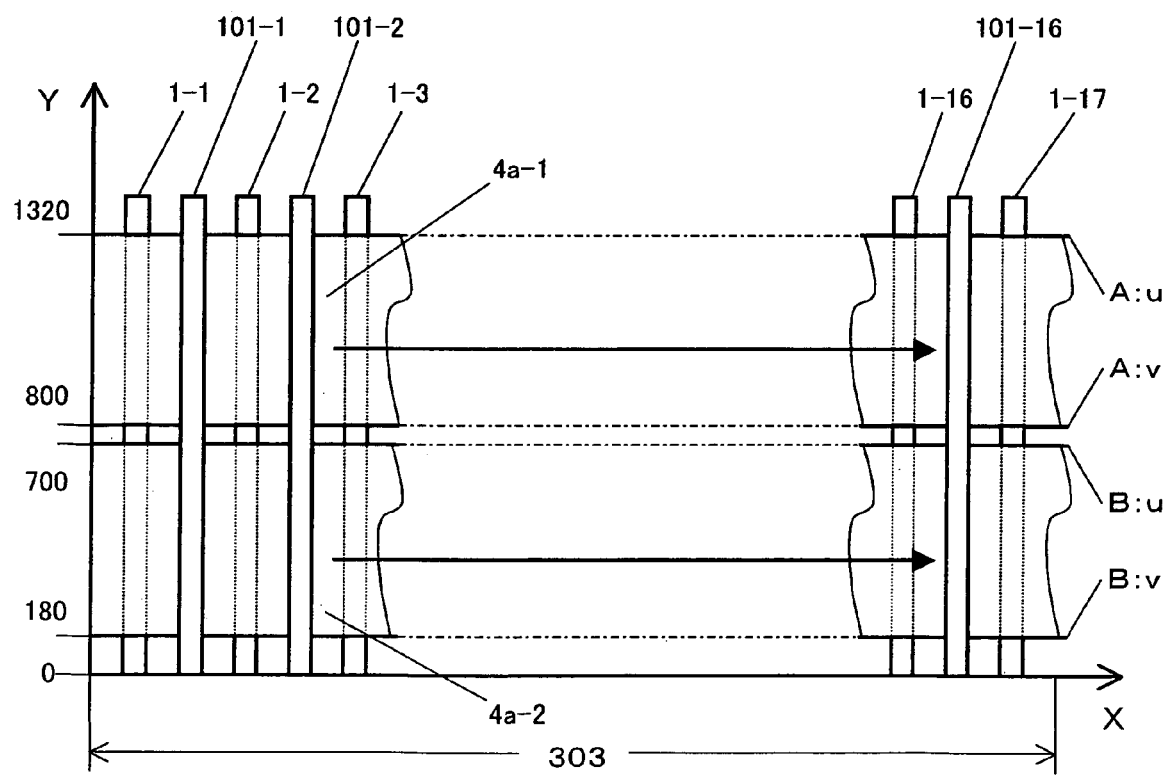
FIG. 7 is a plan view showing the carried positions of the films in Examples 3 and 4.

In FIG. 7, the distance in the axial direction of the cathode rolls 1 is chosen as the ordinate (Y), and the distance in the carrying direction of the films 4a (in the direction perpendicular to the axial direction of the cathode rolls 1) is chosen as the abscissa (X).

In FIG. 7, the carrying line of the film 4a-1 is called line A, and the carrying line of the film 4a-2 is called line B. Symbols A:u and A:v indicate the running positions of both the edges of the film 4a-1, and B:u and B:v indicate the corresponding positions of the film 4a-2. The film carrying positions were very stable as shown in FIG. 9. It did not happen that the two films 4a-1 and 4a-2 overlapped on each other, and they were carried very stably.

Figure 13:
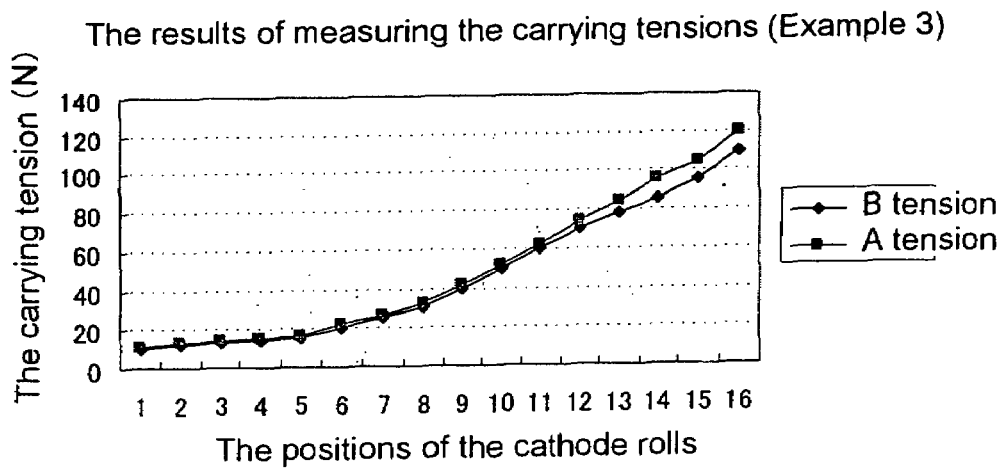
FIG. 13 is a graph showing the results of measuring the tensions of the films in Example 3.

The values of the carrying tension T measured using the measuring instrument shown in FIG. 8 are shown in FIG. 13.

From FIG. 13, it can be seen that the tension was smoothly propagated to the two films 4a-1 and 4a-2.

Later, the surface of copper plating was observed. The surface of the plating had few abnormal projections and depressions, and it was confirmed that copper-plated films having excellent surface appearance quality could be produced. The numbers of abnormal projections and depressions are shown in Table 7. No flaw was observed on the surface of the plating, and the surface roughness of the plating surface was 1 μm as Rmax.

(3) Formation of Patterned Circuits

The films were respectively coated with a photosensitive liquid resist and exposed to ultraviolet light using a mask of a circuit pattern having 1,024 copper wires having a wire width of 30 μm at 30 μm wire intervals, i.e., at a wire pitch of 60 μm, then being developed. Ferric chloride was used as an etchant for forming patterned circuits. Fifty such patterned circuits were observed using a stereomicroscope with a magnification of 150×, and the quality of the patterned circuits was judged in reference to chipping (a chip of 10 μm or more was identified as a defect, and a patterned circuit having even one of 1,024 wires defectively chipped was rejected) and wire breaking. The result is shown in Table 8. The patterned circuits showed a yield of 100%.

TABLE 7

Number of projections and depressions in 520 mm × 100 mm

| Largest diameter of projections and depressions | Example 3 | Example 4 | Comparative Example 3 | Comparative Example 4 |
|---|---|---|---|---|
| 3 to 10 μm | 10 | 15 | >100 | — |
| 11 to 50 μm | 8 | 6 | 83 | — |
| 51 to 100 μm | 0 | 0 | 49 | — |
| 101 μm or more | 0 | 0 | 16 | — |

TABLE 8

| | Example 3 | Example 4 | Comparative Example 3 | Comparative Example 4 |
|---|---|---|---|---|
| Number of acceptable circuits | 50 | 50 | 2 | — |
| Circuits/50 circuits | 100% | 100% | 4% | — |

Example 4

Figure 10:
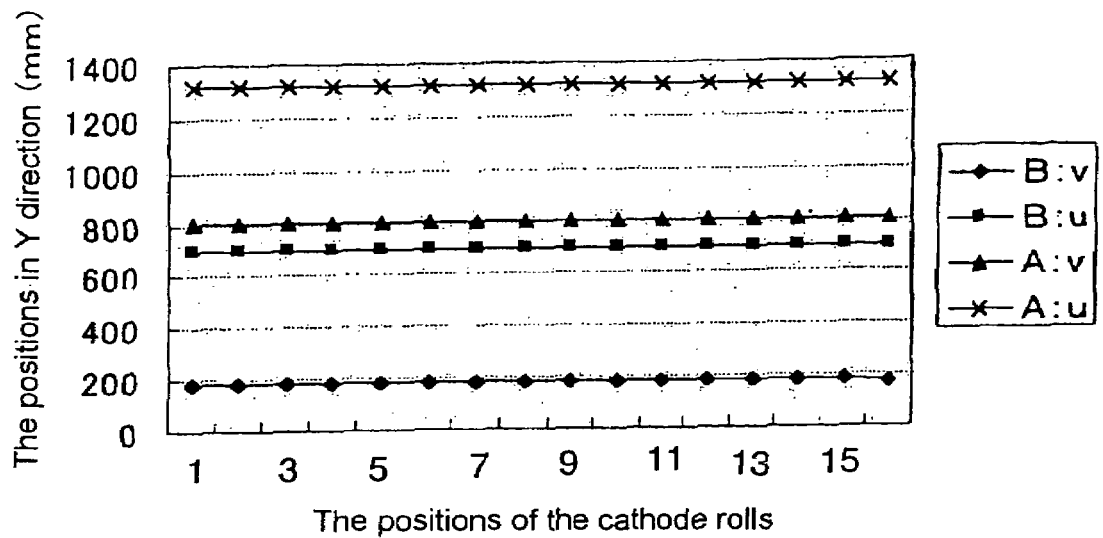
FIG. 10 is a graph showing the carried positions of the films in Example 4.
Figure 14:
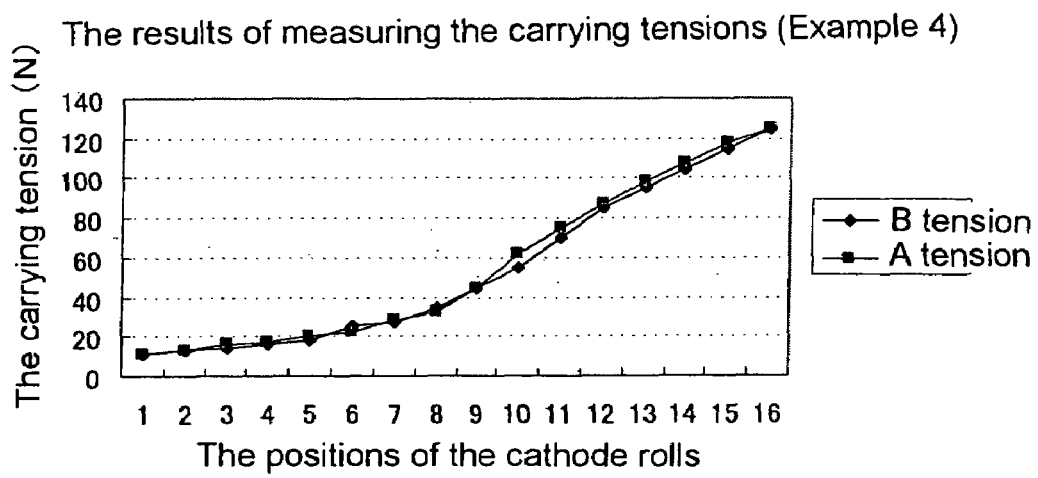
FIG. 14 is a graph showing the results of measuring the tensions of the films in Example 4.

One year later, quite the same production was performed, and as shown in FIGS. 10 and 14 and Tables 7 and 8, virtually the same results as those of Example 1 were obtained.

Comparative Example 3

In this comparative example, copper-plated films were applied to flexible circuit boards.

(1) Production of a Film Having a Conductive Surface

Quite the same film having a conductive surface as that of Example 1 was produced.

(2) Formation of a Plating Layer

The obtained 12,000 m film roll having sputtered layers was divided into four 3,000 m rolls, to prepare four 520 mm×3,000 m film rolls respectively with a conductive surface. Two of them were passed through the following plating apparatus, to form a plating layer.

As the plating apparatus, the apparatus shown in FIG. 1 was used. Copper was used as the anodes 2. Sixteen units, each of which was the unit 6a surrounded by the one-dot-dash line of FIG. 2, were used to constitute a plating circuit and a plating apparatus. A film 4b having an 8 μm thick copper plating layer was produced.

Each of the cathode rolls 1 was a SUS316 cylinder having a diameter of 210 mm, a length of 1,500 mm and a wall thickness of 10 mm. The cathode rolls 1 were ground on the surfaces, to have a surface roughness of 0.6 μm as Rmax after grinding. The cathode rolls 1 were 0.05 mm or less in the roundness, 0.08 mm or less in cylindricity, and 0.08 mm or less in the run-out in the circumferential direction. The Vickers hardness Hv of the surfaces was 70.

When the film 4a was passed from the cathode roll 1-1 along the submerged roll 101-1 to the cathode roll 1-2, the film pass length was 4 m. The pass length refers to the length of the film 4a from the vertex of the cathode roll 1 to the vertex of the next cathode roll. Therefore, the total pass length of the plating section was 64 m.

The pretreatment conditions, plating conditions and rust preventive treatment conditions of the film are shown in Table 1. The current density for copper plating was set to ensure that the current density gradually rose with increase in the number of passes along the cathode roll 1 and the submerged roll 101. The currents set for the respective rectifiers 3 of the first to sixteenth units were as shown in Table 5.

For setting the film tension, the tension was adequately reduced using the S-shaped lap speed control section 309 shown in FIG. 1, and then, the rotating speed of each roll was changed one after another, for drawing the film at different ratios between the respectively adjacent rolls, thereby setting the respective tensions. At the cathode roll (tension detection roll), the pressure was automatically detected using each load cell, and the speed of the drive motor of the speed adjusting section 321 was used for feedback control to ensure that the tension at the cathode roll 325 became 240 N/m. The carrying tensions on each of the cathode rolls 1 were measured using load cell sensors installed on both the sides of the cathode roll 1.

The carrying speed was set at 1 m/min, and the draw ratio was set stepwise when the drive forces of the motors of the respective cathode rolls 1-1 through 1-17 were set, to gradually raise the speed and to gradually raise the tension.

The apparatus could be successfully operated for one week after start of use. However, thereafter, flaws gradually appeared on the surfaces of the cathode rolls 1, and could be visually identified. The films 4a were gripped on the surfaces of the cathode rolls 1, and became tensioned and deflected, and being affected by the stirring air in the plating solution 7, the films 4a began to sway irregularly in the horizontal direction, and were wrinkled on the cathode rolls 1. Furthermore, since the copper-plated film had large stiffness, creases were also observed.

Figure 11:
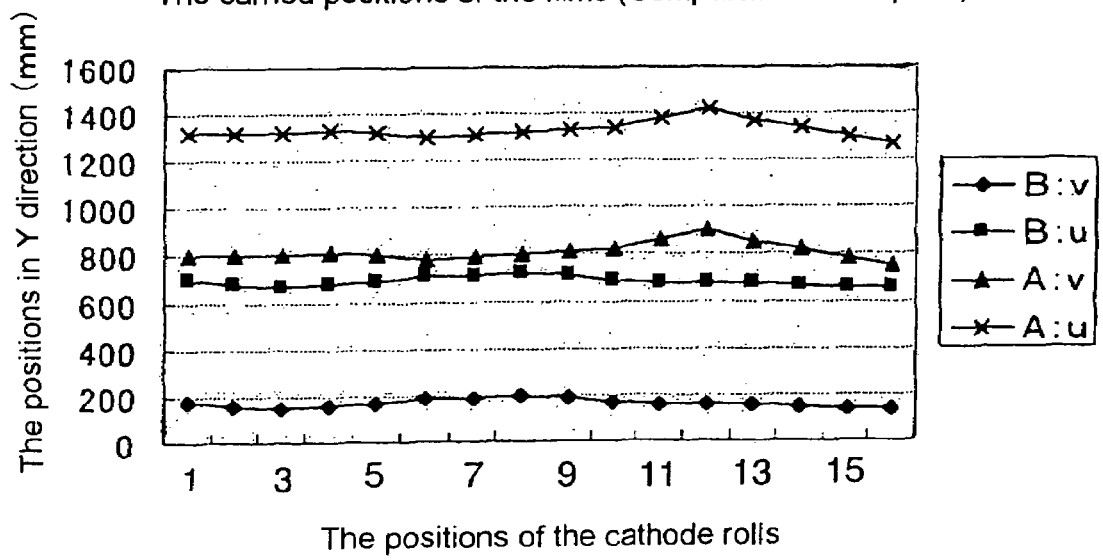
FIG. 11 is a graph showing the carried positions of the films in Comparative Example 3.

The two 3,000 m long films 4a were carried, and the carried positions of 180 minutes after start of carrying are plotted as a graph shown in FIG. 11. The plan view of the plating bath section 303 of FIG. 1 in the state where the two films 4a-1 and 4a-2 were carried is shown in FIG. 7. As for the running states of the two films 4a-1 and 4a-2, they swayed irregularly in the horizontal direction repetitively at the positions where the position-connecting lines are bent in FIG. 11, and the carried states were very unstable.

Figure 15:
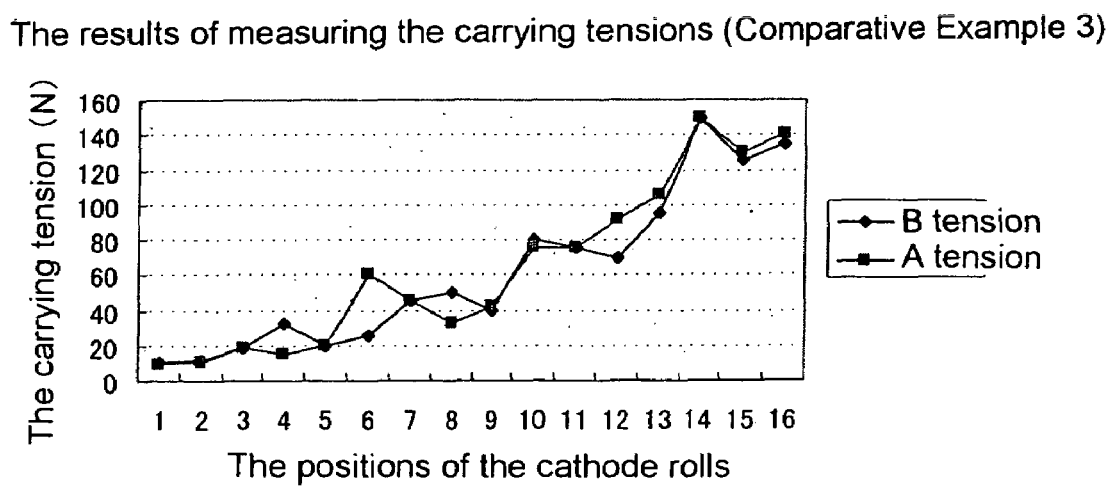
FIG. 15 is a graph showing the results of measuring the tensions of the films in Comparative Example 3.

The values of the carrying tension T measured using the measuring instrument shown in FIG. 8 are shown in FIG. 15. It can be seen that the tension propagation varied at random for the two films 4a-1 and 4a-2.

Later, the surface of copper plating was observed. The films could not be used as products because of the creases and even in some places free from creases, numerous abnormal projections of 100 μm in major axis and 60 μm in height were formed here and there in the film carrying direction. The numbers of abnormal projections and depressions are shown in Table 7. Furthermore, when the surface appearance quality was observed, flaws similar to the flaws of the cathode rolls 1 were observed, and the surface roughness was as very large as 20 μm as Rmax. It is considered that the flaws of the cathode rolls 1 were reproduced on the surfaces of the films 4b.

(3) Formation of Patterned Circuits

The films were coated with a photosensitive liquid resist and exposed to ultraviolet light using a mask of a circuit pattern having 1,024 copper wires having a wire width of 30 μm at 30 μm wire intervals, i.e., at a wire pitch of 60 μm, then being developed. Ferric chloride was used as an etchant for forming patterned circuits. Fifty such patterned circuits were observed using a stereomicroscope with a magnification of 150×, and the quality of the patterned circuits was judged in reference to chipping (a chip of 10 μm or more was identified as a defect, and a patterned circuit having even one of 1,024 wires defectively chipped was rejected) and wire breaking. The result is shown in Table 8. The patterned circuits showed a yield of 4%, and few normal patterned circuits could be obtained.

Comparative Example 4

In this comparative example, copper-plated films were applied for flexible circuit boards.

Under quite the same conditions as in Comparative Example 1, production operation was repeated for 3 months. During the period, the two films 4a-1 and 4a-2 swayed very irregularly in the horizontal direction, and overlapped on each other. The respective films were wrinkled and creased, and normal production could not be performed.

Figure 12:
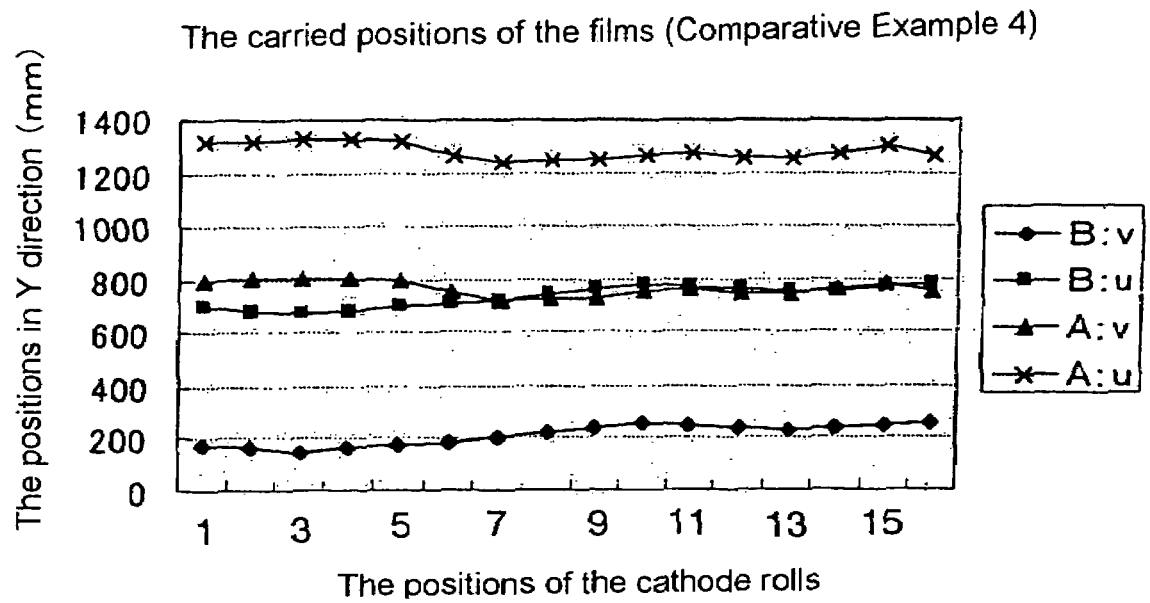
FIG. 12 is a graph showing the carried positions of the films in Comparative Example 4.

The 3,000 m long films 4a-1 and 4a-2 were carried, and the carried positions of 70 minutes later were plotted as a graph in FIG. 12. The plan view of the plating bath section 303 of FIG. 1 in the state where the two films 4a-1 and 4a-2 were carried is shown in FIG. 7. As for the running states of the two films 4a-1 and 4a-2, they swayed irregularly in the horizontal direction repetitively at the positions where the position-connecting lines are bent in FIG. 12, and the carried states were very unstable.

Figure 16:
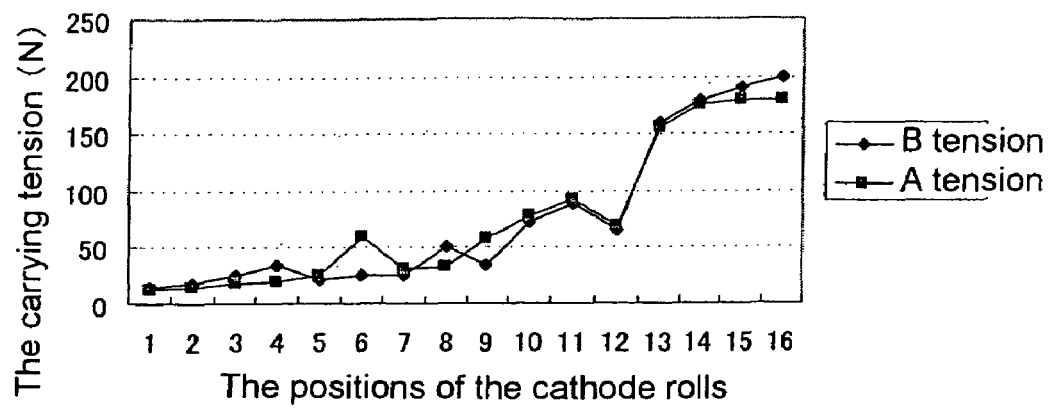
FIG. 16 is a graph showing the results of measuring the tensions of the films in Comparative Example 4.
Figure 17:
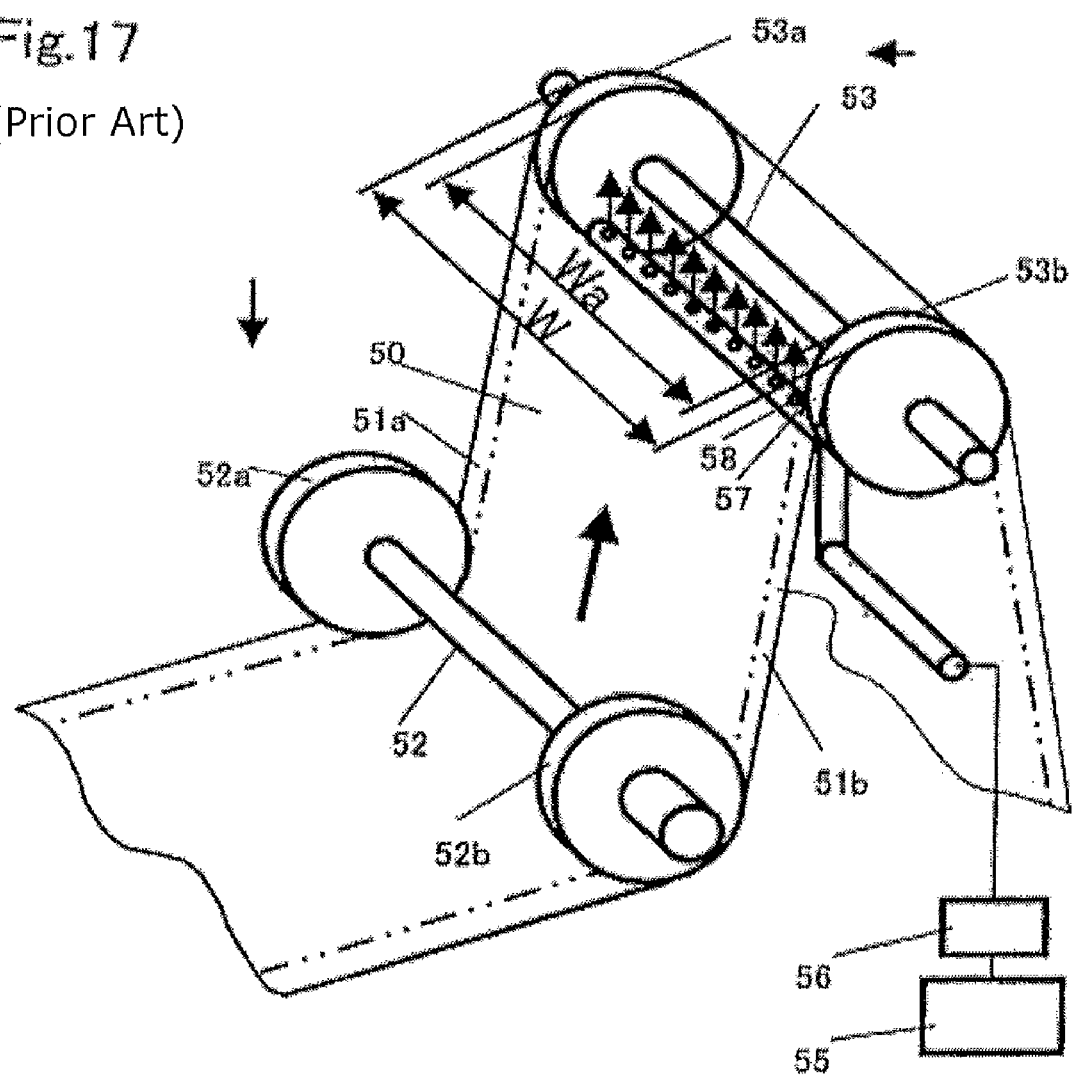
FIG. 17 is a perspective view showing the conventional non-contact carrying device for a film disclosed in JP-3135176.

The values of the carrying tension T measured using the measuring instrument shown in FIG. 8 are shown in FIG. 16. It can be seen that the tension propagation varied at random for the two films 4a-1 and 4a-2. The surfaces of the cathode rolls 1 were examined, and numerous flaws of about 0.5 mm in depth were observed to exist.

As can be seen from the values shown in Table 8, the copper-plated film produced using the cathode rolls for plating of the invention by the production method of the invention is very good in the surface state of the plating layer. Therefore, the copper-plated film is suitable for producing flexible circuit boards formed at a fine wire pitch. The copper-plated film is excellent also in productivity.

INDUSTRIAL APPLICABILITY

According to the invention, a plating layer excellent in surface appearance quality can be formed on a conductive surface of a film, and a plated film with excellent appearance quality can be produced at excellent productivity. The produced plated film can be preferably used as abase of circuit boards, especially as a base of flexible circuit boards having circuits formed at a wire pitch of 60 μm or less.

The invention claimed is:

1. A method for producing a plated film, comprising the steps of: carrying a resin film having a conductive surface into a plating solution accommodated in a plating bath provided with an anode, passing the resin film through the plating solution and, carrying the resin film from the plating bath to run along a cathode roll which is arranged outside and in the downstream side of the plating bath, wherein the conductive surface of the resin film is brought into electrical contact with the cathode roll through an electrolyte layer for electroplating a plating layer on the conductive surface of the film, and wherein the following relation is satisfied:

$$E_0 > [(I/C_s) \times d]/\sigma$$

where $E_0$ is the reduction potential of a metal constituting the plating layer; I is the value of a current flowing through the cathode roll for plating; $C_s$ is the area of the conductive surface of the resin film in electrical contact with the cathode roll through the electrolyte layer; d is the thickness of a gap between the cathode roll and the conductive surface of the resin film; and σ is the conductivity of a liquid constituting the electrolyte layer, and further wherein the carrying tension T of the resin film is from 10 N/m to 320 N/m.

2. A method for producing a plated film, according to claim 1, wherein the conductivity σ of the liquid constituting the electrolyte layer existing in the gap is controlled by means of the concentration of an electrolyte mainly composed of sulfuric acid.

3. A method for producing a plated film, according to claim 1, wherein the conductivity σ of the liquid constituting the electrolyte layer existing in the gap is from 1 mS/cm to 100 mS/cm.

4. A method for producing a plated film, according to claim 1, wherein the thickness d of the gap is from 20 μm to 500 μm.

5. A method for producing a plated film, according to claim 4, wherein the thickness d of the gap is controlled by means of a carrying tension of the resin film.

6. A method for producing a plated film, according to claim 1, wherein the plating layer is composed of copper.

7. A method for producing a plated film, according to claim 1, wherein the resin film is made of a polyimide resin or polyester resin.

8. A method for producing a plated film according to claim 1, wherein the electrolyte layer is supplied by a separate electrolyte accommodating pan.

* * * * *

UNITED STATES PATENT AND TRADEMARK OFFICE
CERTIFICATE OF CORRECTION

PATENT NO. : 7,618,526 B2  Page 1 of 1
APPLICATION NO. : 10/518194
DATED : November 17, 2009
INVENTOR(S) : Nomura et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1093 days.

Signed and Sealed this

Twenty-sixth Day of October, 2010

David J. Kappos
*Director of the United States Patent and Trademark Office*